(12) United States Patent
Terada et al.

(10) Patent No.: US 12,347,803 B2
(45) Date of Patent: Jul. 1, 2025

(54) MOUNTING DEVICE AND MOUNTING METHOD

(71) Applicant: TORAY ENGINEERING CO., LTD., Tokyo (JP)

(72) Inventors: Katsumi Terada, Otsu (JP); Kenji Hamakawa, Otsu (JP); Takashi Hare, Otsu (JP); Yasushi Tamura, Otsu (JP); Kensuke Tashima, Otsu (JP); Takashi Yoneda, Otsu-shi (JP)

(73) Assignee: TORAY ENGINEERING CO., LTD., Tokyo (JP)

( * ) Notice: Subject to any disclaimer, the term of this patent is extended or adjusted under 35 U.S.C. 154(b) by 148 days.

(21) Appl. No.: 18/152,478

(22) Filed: Jan. 10, 2023

(65) Prior Publication Data

US 2023/0163096 A1 May 25, 2023

Related U.S. Application Data

(63) Continuation of application No. PCT/JP2021/025715, filed on Jul. 8, 2021.

(30) Foreign Application Priority Data

| Jul. 13, 2020 | (JP) | ................................. | 2020-119622 |
| Mar. 31, 2021 | (JP) | ................................. | 2021-061465 |

(51) Int. Cl.
| *H05K 13/08* | (2006.01) |
| *H01L 23/00* | (2006.01) |
| *H05K 13/04* | (2006.01) |

(52) U.S. Cl.
CPC .............. *H01L 24/75* (2013.01); *H01L 24/83* (2013.01); *H05K 13/04* (2013.01);

(Continued)

(58) Field of Classification Search
CPC .................................................. H05K 13/0815
See application file for complete search history.

(56) References Cited

U.S. PATENT DOCUMENTS

| 11,823,938 B2 * | 11/2023 | Tamura | ................. | H01L 21/681 |
| 2021/0313211 A1 * | 10/2021 | Yamauchi | .............. | H05K 13/04 |
| 2021/0351056 A1 * | 11/2021 | Tamura | ................. | H01L 21/681 |

FOREIGN PATENT DOCUMENTS

| JP | 2000-276233 A | * | 10/2000 |
| JP | 2004-127981 A | * | 4/2004 |

(Continued)

OTHER PUBLICATIONS

International Search Report of the corresponding International Application No. PCT/JP2021/025715, dated Oct. 12, 2021.

*Primary Examiner* — Jeffry H Aftergut
(74) *Attorney, Agent, or Firm* — Global IP Counselors, LLP

(57) ABSTRACT

A mounting device comprises a substrate stage, a mounting head, an elevating unit, a recognition mechanism, and a control unit. The recognition mechanism acquires position information about a chip recognition mark and a substrate recognition mark using an imaging unit. The control unit calculates an amount of positional deviation between a chip component and a substrate from the position information about the chip recognition mark and the substrate recognition mark, and performs alignment by driving the mounting head and/or the substrate stage according to the amount of the positional deviation. The chip component and the substrate are brought closer with each other and the alignment is performed in a state in which the imaging unit simultaneously images the chip recognition mark and the substrate recognition mark within a depth of field, after which the chip component and the substrate are brought into close contact with each other.

23 Claims, 14 Drawing Sheets

(52) U.S. Cl.
CPC ..... *H05K 13/0812* (2018.08); *H05K 13/0815* (2018.08); *H01L 2224/75252* (2013.01); *H01L 2224/7565* (2013.01); *H01L 2224/75745* (2013.01); *H01L 2224/75753* (2013.01); *H01L 2224/75804* (2013.01); *H01L 2224/75824* (2013.01); *H01L 2224/8313* (2013.01); *H01L 2224/83132* (2013.01); *H01L 2224/83201* (2013.01)

(56) References Cited

FOREIGN PATENT DOCUMENTS

| | | | |
|---|---|---|---|
| JP | 2008-109057 A | | 5/2008 |
| JP | 2010-283010 A | | 12/2010 |
| JP | 2015-130414 A | * | 7/2015 |
| JP | 2017-208522 A | * | 11/2017 |
| JP | 2020-119972 A | | 8/2020 |
| WO | WO-03/041478 A1 | * | 5/2003 |
| WO | 2020/044580 A1 | | 3/2020 |

* cited by examiner

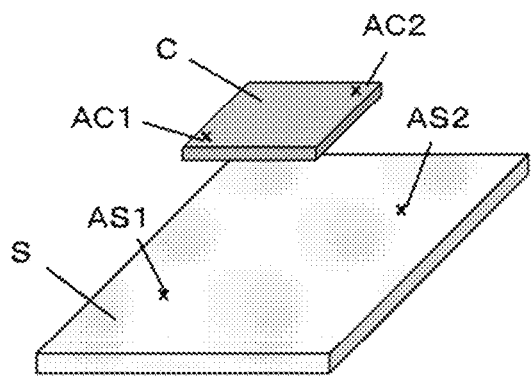
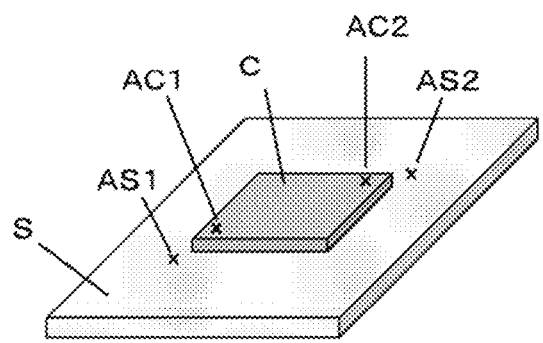
FIG. 24A                FIG. 24B
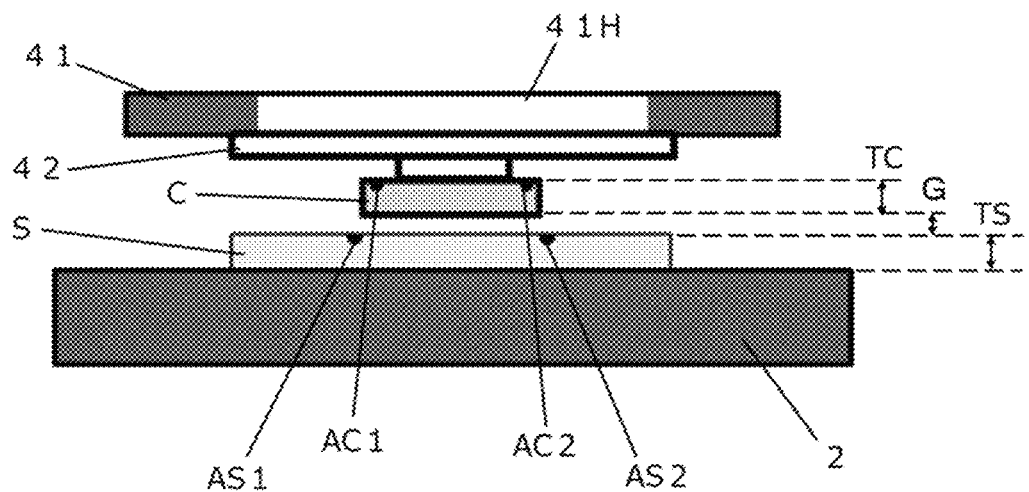
FIG. 25
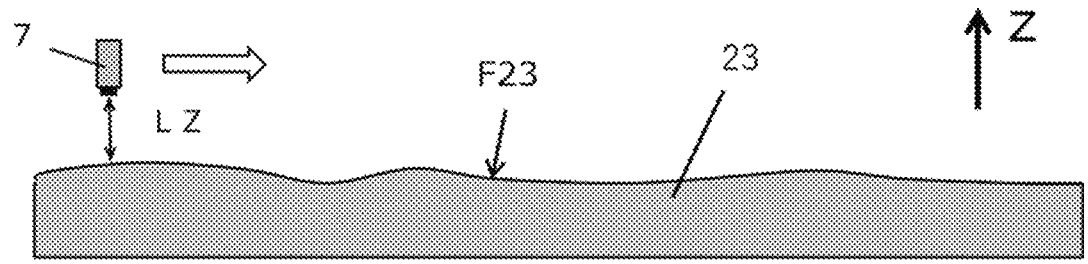
FIG. 26

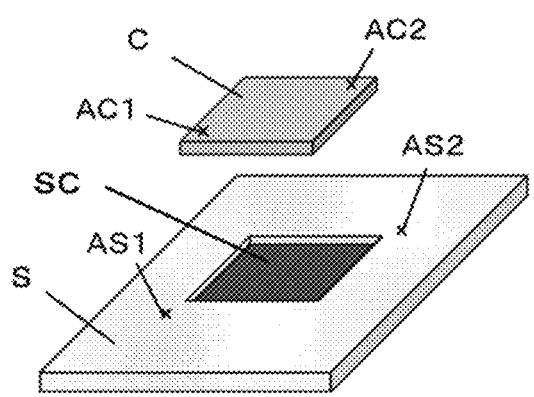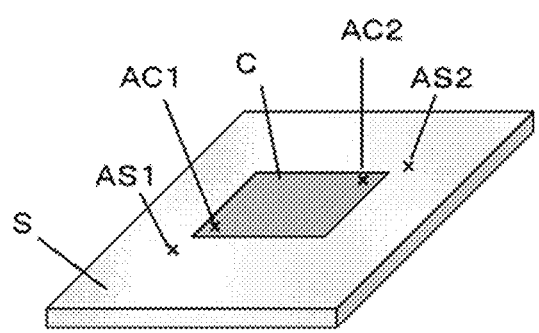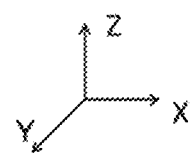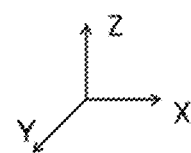
FIG. 27A  FIG. 27B

MOUNTING DEVICE AND MOUNTING METHOD

CROSS-REFERENCE TO RELATED APPLICATIONS

This application is a continuation application of PCT International Application No. PCT/JP2021/025715 filed on Jul. 8, 2021, which claims priority to Japanese Patent Application Nos. 2020-119622 filed on Jul. 13, 2020 and 2021-061465 filed on Mar. 31, 2021. The entire disclosures of PCT International Application No. PCT/JP2021/025715 and Japanese Patent Application Nos. 2020-119622 and 2021-061465 are hereby incorporated herein by reference.

BACKGROUND

Field of the Invention

The present invention relates to a mounting device and mounting method with which a chip component is mounted on a substrate. In particular, the present invention relates to a mounting device and a mounting method with which face-up mounting is performed so that the electrode surface of a substrate and the electrode surface of a chip component are oriented in the same direction.

Background Information

As one mode of mounting a chip component such as a semiconductor chip on a substrate such as a wiring board, there is face-up mounting, in which the electrode surface of the substrate and the electrode surface of the chip component are mounted in the same direction.

In face-up mounting, the electrodes on the substrate and the electrodes on the chip component are not directly joined, but alignment is required to mount the chip component at the specified position on the substrate, so recognition marks used for alignment are made on the chip component and the substrate. Here, the purpose of aligning the chip component with a specific position on the substrate is so that the electrodes of the substrate and the electrode of the chip component will be mounted within a specific accuracy, it is common practice for the recognition mark position to be disposed using the electrode position as a reference, and to be made on the electrode surface side where the relative positions are clear.

In face-up mounting, when aligning the chip component on the substrate, technique has been proposed in which the recognition marks can be seen through the mounting head by some kind of design such as using a transparent member for the part of the mounting head that holds the chip component (for example, International Publication No. 2003/041478 (Patent Literature 1) and Japanese Patent Application Publication No. 2017-208522 (Patent Literature 2)).

SUMMARY

Remarkable progress has been made in mounting semiconductor components more densely, increasing the number of electrodes, and narrowing the pitch, and there is a need for a mounting device that can perform face-up mounting and can perform more accurate alignment than in the past at high speed, without a significant cost increase. In the device described in Patent Literature 2, there is a height difference between the chip recognition mark and the substrate recognition mark at the alignment stage, so the optical path lengths are different for a first chip recognition mark AC1 and a substrate recognition first mark AS1 (and for a the second chip recognition mark AC2 and a substrate recognition second mark AS2), and it is difficult to acquire images of the chip recognition mark and the substrate recognition mark simultaneously at high resolution due to matters related to the depth of field, and it is necessary to drive an imaging unit in order to focus on each recognition mark, which poses problems such as a decrease in mounting accuracy and a decrease in productivity. Furthermore, the structure of the reflective optical system is extremely complicated, so another problem is higher cost.

In order to solve these problems, the applicant has invented a mounting device in which a chip recognition imaging means for recognizing a chip recognition mark and a substrate recognition imaging means for recognizing a substrate recognition mark are provided independently, and are provided so that the focal positions are different through a shared optical axis path, and this provides a recognition mechanism capable of simultaneously recognizing a chip recognition mark and a substrate recognition mark (Japanese Patent Application Publication No. 2020-119972 (Patent Literature 3), for example), and has achieved high-speed and high-precision alignment without a significant increase in cost.

Incidentally, the demand for high-precision mounting is increasing day by day, and there is a need for a mounting device having precision on the submicron level. However, at present, the mounting precision sometimes exceeds 1 μm even when submicron-level alignment is performed. That is, the effect of variance in straightness when the mounting head descends from the alignment height to the mounting height results in errors in the step from alignment to mounting that cannot be ignored.

Meanwhile, a mode in which chip components are mounted by being embedded in an embedded substrate (a substrate with built-in components) is becoming increasingly common today. That is, there are mounting modes in which a mounting location of a substrate is in a concave portion, and in which embedding is performed, and there is a need for an alignment method that is suited to such mounting modes.

One object of the present disclosure is to provide a mounting device and a mounting method with which high-precision mounting on the submicron level is possible in face-up mounting in which the electrode surface of a substrate and the electrode surface of a chip component are oriented in the same direction.

In order to solve the above problems, a mounting device according to a first aspect is a mounting device with which a chip component having a chip recognition mark for alignment and a substrate having a substrate recognition mark for alignment are mounted face-up in an orientation in which the chip recognition mark and the substrate recognition mark face upward, the mounting device comprising a substrate stage configured to hold the substrate, a mounting head configured to hold the chip component, an elevating unit configured to raise and lower the mounting head in a direction perpendicular to the substrate, a recognition mechanism having an imaging unit, the recognition mechanism being configured to recognize the chip recognition mark and the substrate recognition mark through the mounting head, from above the mounting head, and configured to move in an in-plane direction of the substrate, and a control unit operatively connected to the recognition mechanism, the control unit being configured to calculate an amount of positional deviation between the chip component and the substrate from position information about the chip recognition mark and the substrate recognition mark obtained from the recognition mechanism, and configured to perform alignment by driving the mounting head and/or the substrate stage according to the amount of the positional deviation, the chip component and the substrate being brought closer with each other and the alignment being performed in a state in which the imaging unit simultaneously images the chip recognition mark and the substrate recognition mark within a depth of field, after which the chip component and the substrate are brought into close contact with each other.

A mounting device according to a second aspect is the mounting device according to the first aspect, wherein the control unit is configured to recognize the substrate recognition mark of the substrate held on the substrate stage by the imaging unit and configured to store position information about a place where the chip component is to be mounted on the basis of position information about the substrate obtained from the imaging unit.

A mounting device according to a third aspect is the mounting device according to the second aspect, further comprising a chip conveyance unit having a chip slider that is configured to transfer the chip component to the mounting head, position information about the chip recognition mark of the chip component transferred from the chip slider to the mounting head being acquired by the imaging unit and compared with the position information about the place where the chip component is to be mounted on the substrate, the chip component and the substrate being brought closer with each other while a comparison result is within a permissible range, and the alignment being performed in a state in which the imaging unit simultaneously images the chip recognition mark and the substrate recognition mark within the depth of field, after which the chip component and the substrate are brought into close contact with each other.

A mounting device according to a fourth aspect is a mounting device with which a chip component having a chip recognition mark for alignment is mounted at a mounting location on a substrate having a substrate recognition mark for alignment in an orientation in which the chip recognition mark and the substrate recognition mark face a same direction, the mounting device comprising a substrate stage configured to hold the substrate, a mounting head configured to hold the chip component, an elevating unit configured to raise and lower the mounting head in a direction perpendicular to the substrate, a recognition mechanism configured to acquire position information about the chip recognition mark and the substrate recognition mark using an imaging unit, and configured to move in an in-plane direction of the substrate, and a control unit operatively connected to the recognition mechanism, the control unit being configured to calculate an amount of positional deviation between the chip component and the substrate from the position information about the chip recognition mark and the substrate recognition mark obtained from the recognition mechanism, and configured to perform alignment by driving the mounting head and/or the substrate stage according to the amount of the positional deviation, the chip component and the substrate being brought closer with each other and the alignment being performed in a state in which the imaging unit simultaneously images the chip recognition mark and the substrate recognition mark within a depth of field, after which the chip component and the substrate are brought into close contact with each other.

A mounting device according to a fifth aspect is the mounting device according to the fourth aspect, wherein the recognition mechanism is configured to acquire the position information about the substrate recognition mark on the substrate held on the substrate stage, and the control unit is configured to control the substrate stage on the basis of the position information about the substrate recognition mark to dispose the mounting location on the substrate directly under the mounting head.

A mounting device according to a sixth aspect is the mounting device according to the fifth aspect, further comprising a chip conveyance unit having a chip slider that is configured to transfer the chip component to the mounting head, positional deviation of the chip component with respect to the mounting location being calculated from the position information about the chip recognition mark obtained by using the imaging unit to image the chip component transferred from the chip slider to the mounting head, and the mounting head being lowered while the positional deviation is within an allowable range, and the chip component and the substrate being brought closer with each other until the imaging unit simultaneously images the chip recognition mark and the substrate recognition mark within the depth of field.

A mounting device according to a seventh aspect is the mounting device according to the sixth aspect, wherein an amount of movement necessary to bring the chip component within the allowable range is calculated while the positional deviation is outside the allowable range, and after the chip component is moved until it falls within the allowable range, the chip component and the substrate are brought closer with each other until the imaging unit simultaneously images the chip recognition mark and the substrate recognition mark within the depth of field.

A mounting device according to an eighth aspect is the mounting device according to the first aspect or the fourth aspect, the imaging unit of the recognition mechanism includes a chip recognition imaging unit that is configured to focus on the chip recognition mark and a substrate recognition imaging unit that is configured to focus on the substrate recognition mark, the chip recognition imaging unit and the substrate recognition imaging unit being provided to branched optical paths having a shared optical axis.

A mounting device according to a ninth aspect is the mounting device according to the eighth aspect, the chip component and the substrate are brought closer with each other until either the chip recognition imaging unit or the substrate recognition imaging unit simultaneously images the chip recognition mark and the substrate recognition mark within the depth of field while relation between the position information about the chip recognition mark obtained using the chip recognition imaging unit and the position information about the substrate recognition mark obtained using the substrate recognition imaging unit is within an allowable range.

A mounting device according to a tenth aspect is the mounting device according to the ninth aspect, an amount of movement necessary to bring the chip component within the allowable range is calculated while the relation between the position information about the chip recognition mark obtained using the chip recognition imaging unit and the position information about the substrate recognition mark obtained using the substrate recognition imaging unit is outside the allowable range, and after the chip component is moved until it falls within the allowable range, the chip component and the substrate are brought closer with each other until the imaging unit simultaneously images the chip recognition mark and the substrate recognition mark within the depth of field.

A mounting device according to an eleventh aspect is the mounting device according to any one of the first aspect to the tenth aspect, further comprising a length measurement unit configured to measure distance between a surface of the substrate and a lower surface of the chip component, height of the mounting head when performing the alignment being determined on the basis of a measurement result from the length measurement unit.

A mounting device according to a twelfth aspect is the mounting device according to the eleventh aspect, wherein the length measurement unit is provided to the mounting head.

A mounting device according to a thirteenth aspect is the mounting device according to the eleventh aspect or the twelfth aspect, wherein in-plane height distribution of the substrate or the substrate stage being obtained by the length measurement unit.

A mounting method according to a fourteenth aspect is a mounting method with which a chip component having a chip recognition mark for alignment is mounted on a substrate having a substrate recognition mark for alignment in an orientation in which the chip recognition mark and the substrate recognition mark face upward, the mounting method making use of a substrate stage configured to hold the substrate, a mounting head configured to hold the chip component, an elevating unit configured to raise and lower the mounting head in a direction perpendicular to the substrate, and a recognition mechanism configured to acquire position information about the chip recognition mark and the substrate recognition mark using an imaging unit, and configured to move in an in-plane direction of the substrate, the mounting method comprising performing precision alignment after the chip component and the substrate are brought closer with each other until the imaging unit simultaneously images the chip recognition mark and the substrate recognition mark within a depth of field, and performing a pressure bonding by further lowering the mounting head after the performing of the precision alignment to bring the chip component and the substrate into close contact with each other, and by joining the chip component and the substrate.

A mounting method according to a fifteenth aspect is the mounting method according to the fourteenth aspect, further comprising, prior to the performing of the precision alignment, recognizing the substrate recognition mark of the substrate held on the substrate stage by the imaging unit, and disposing a mounting location on the substrate where the chip component is to be mounted directly under the mounting head on the basis of position information about the substrate obtained from the imaging unit, and performing a preliminary alignment by calculating an amount of positional deviation between the chip component and the substrate from the position information about the chip recognition mark obtained from the recognition mechanism and position information about the mounting location, and by correcting the positional deviation.

A mounting method according to a sixteenth aspect is the mounting method according to the fifteenth aspect, wherein the correcting of the positional deviation including correcting the positional deviation by driving the mounting head and/or the substrate stage while the amount of the positional deviation exceeds an allowable range.

A mounting method according to a seventeenth aspect is the mounting method according to the fifteenth aspect or the sixteenth aspect, wherein the preliminary alignment is performed at a height of the mounting head equal to or greater than a height at which the chip component is transferred from the chip conveyance unit.

With the present invention, in face-up mounting in which the electrode surface of a substrate and the electrode surface of a chip component are oriented in the same direction, high-precision mounting at the submicron level becomes possible. In particular, this invention is suitable for high-precision mounting of chip components on embedded substrates.

BRIEF DESCRIPTION OF THE DRAWINGS

FIG. 7B is a diagram showing the same state from the side;

FIGS. 24A and 24B illustrate an example of face-up mounting of a chip component on a flat substrate, with FIG. 24A being a diagram showing a state in which the chip component is separated from the substrate, and FIG. 24B a diagram showing the mounted state;

FIG. 25 is a diagram illustrating a condition under which the mounting device according to the embodiment of the present disclosure is also applied to mounting using a flat substrate;

FIG. 26 is a diagram illustrating the function of a displacement sensor in the embodiment of the present disclosure; and FIGS. 27A and 27B are diagrams illustrating face-up mounting to an embedded substrate, with FIG. 27A being a diagram showing a state in which the bottom of the chip component is separated from the bottom of the concave portion of the substrate, and FIG. 27B a diagram showing the mounting state.

DETAILED DESCRIPTION OF EMBODIMENTS

Figure 1:
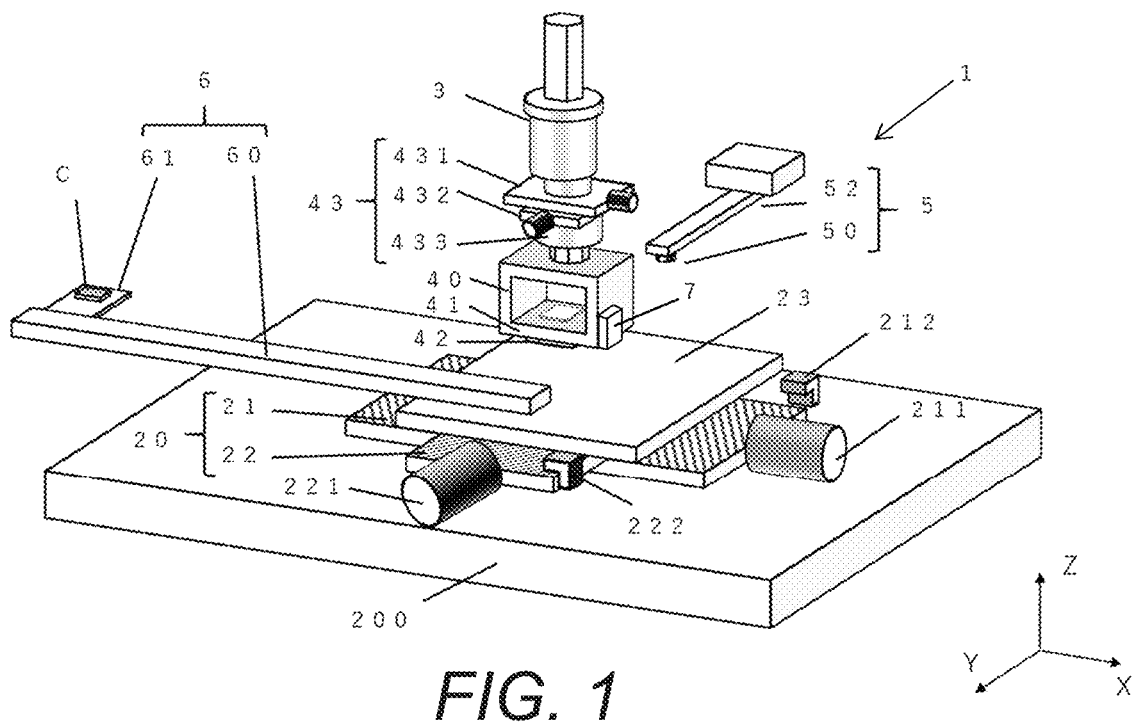
FIG. 1 is a schematic diagram of a mounting device according to an embodiment of the present disclosure.

Selected embodiments of the present disclosure will be described with reference to the drawings. FIG. 1 is a schematic diagram of a mounting device 1 in an embodiment of the present disclosure.

A mounting device mounts a chip component on a substrate such as a wiring board, and the mounting device 1 shown in FIG. 1 is configured to be suited to face-up mounting, in which the electrode surface of the chip component and the electrode surface of the substrate are mounted in the same direction.

The constituent elements of the mounting device 1 include a substrate stage 2, an elevating and pressing unit 3

(e.g., an elevating means or unit), a bonding head 4, a recognition mechanism 5, and a chip conveyance means or unit 6.

In the mounting device 1 in FIG. 1, the substrate stage 2 is constituted by a stage movement control means or unit 20 and a suction table 23. The suction table 23 uses suction to hold a substrate placed on its surface, and the suction table 23 is able to move in the in-plane direction of the substrate surface in a state in which the substrate is held by the stage movement control means 20.

The stage movement control means 20 is constituted by a Y direction stage movement control means or unit 22 that is capable of moving the suction table 23 linearly in the Y direction, and an X direction stage movement control means or unit 21 that is provided on a base 200 and is capable of moving the Y direction stage movement control means 22 in the X direction. The Y direction movement control means 22 has a movable portion that is disposed on a slide rail and on which the suction table 23 is mounted, and the movement and position of the movable portion are controlled by a Y direction servo 221. The X direction movement control means 21 has a movable portion that is disposed on a slide rail and on which the Y direction movement control means 22 is mounted, and the movement and position of the movable portion are controlled by an X direction servo 211.

The elevating and pressing unit 3 is fixed to a gate-shaped frame (not shown), has a vertical drive shaft provided in a direction perpendicular to the suction table 23, and links the mounting head 4 to the vertical drive shaft. The elevating and pressing unit 3 has a function of driving the mounting head 4 up and down, and applying pressure according to the setting. Also, with the mounting device 1, the elevating and pressing unit 3 is supported from two directions, and is linked linearly to the mounting head 4, so a lateral force is less likely to be applied to the mounting head 4 during pressure application. In the illustrated embodiment, the elevating and pressing unit 3 includes an electronic actuator or motor (i.e., an elevation actuator or motor) that drives the vertical drive shaft to drive the mounting head 4 up and down.

The mounting head 4 holds a chip component C and pressure-bonds it parallel to the substrate (held by the suction table 23 of the substrate stage 2). The constituent elements of the mounting head 4 include a head body 40, a heater unit or heater 41, an attachment tool 42, and a tool position control means or unit 43. The head body 40 is linked to the elevating and pressing unit 3 via the tool position control means 43, and the heater unit 41 is fixedly disposed on the lower side. The heater unit 41 has a heat generating function, and heats the chip component C through the attachment tool 42. Also, the heater unit 41 has a function of holding the attachment tool 42 with suction, using a reduced-pressure channel. The attachment tool 42 holds the chip component C with suction, and is replaced to match the shape of the chip component C. The tool position control means 43 finely adjusts the position of the head body 40 in the in-plane direction perpendicular to the vertical drive shaft of the elevating and pressing unit 3, and adjusts the positions of the attachment tool 42 and the chip component C held by the attachment tool 42 (within the XY plane in the drawings). In the illustrated embodiment, the tool position control means 43 includes one or more electronic actuators or motors, for example.

The constituent elements of the tool position control means 43 include the electronic actuators that form an X direction tool position control means or unit 431, a Y direction tool position control means or unit 432, and a tool rotation control means or unit 433, respectively. In the embodiment shown in FIG. 1, the configuration is such that the tool rotation control means 433 adjusts the rotation direction of the head body 40, the Y direction tool position control means 432 adjusts the Y direction position of the tool rotation control means 433, and the X direction tool position control means 431 adjusts the X direction position of the Y direction position control means 432, but this is not the only option, so long as the X direction position, the Y direction position, and the rotation angle of the head body 40 (and any lower constituent elements) can be adjusted.

Figures 2A, 2B:
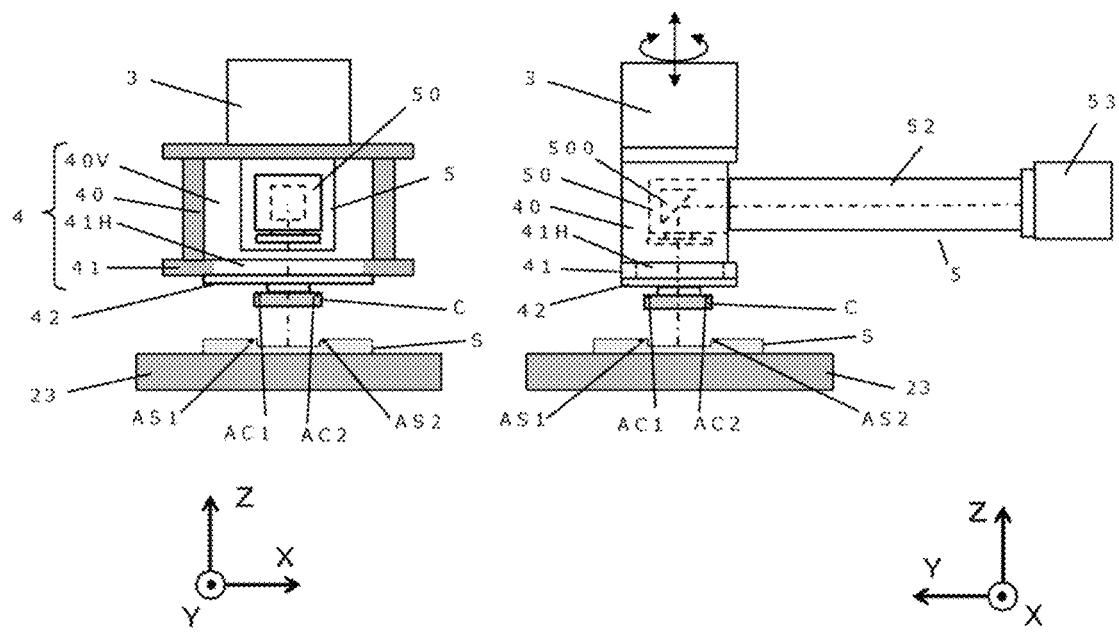
FIG. 2A is a diagram showing the constituent elements of the mounting device according to the embodiment of the present disclosure.
FIG. 2B is a diagram showing the constituent elements of the mounting device as seen from the side.

FIGS. 2A and 2B mainly show the periphery of the head body 40 (FIG. 2A is a front view, and FIG. 2B is a side view), but in the face-up mounting of this embodiment, as shown in FIGS. 27A and 27B, chip recognition marks AC (first chip recognition mark AC1 and second chip recognition mark AC2) are provided at diagonally opposite locations of the electrode surface of the chip component C, and substrate recognition marks AS (first substrate recognition mark AS1 and second substrate recognition mark AS2) are provided at guide positions at diagonally opposite mounting locations of the chip component on the electrode surface of the substrate S, with all of the marks facing in the direction of the mounting head 4. For example, in this embodiment, as shown in FIGS. 27A and 27B, the chip component C is mounted by being embedded in the embedded substrate S (a substrate with built-in components). That is, in this embodiment, a mounting location SC of the substrate S is in a concave portion as shown in FIG. 27A, and embedding is performed as shown in FIG. 27B.

In view of this, the mounting device 1 is configured so that the chip recognition marks AC can be observed through the mounting head 4, and either the attachment tool 42 is formed from a transparent member or a through-hole is provided that lines up with the positions of the chip recognition marks AC. Also, the heater unit 41 either must be made of a transparent member or have an opening so that the chip recognition marks AC can be observed, and in this embodiment, a through-hole 41H is provided, as shown in FIGS. 2A and 2B. Here, through-holes 41H may be provided to line up with the positions of the individual chip recognition marks AC, but the hole may instead be shaped so as to accommodate the entire range of size specifications in order to eliminate the need for replacement due to the shape of the chip component C. Also, since a space into which an image capture unit 50 of the recognition mechanism 5 can enter is required in order to observe the chip recognition marks AC and/or the substrate recognition marks AS, the mounting head 4 is provided with a head space 40V as shown in FIG. 2A in this embodiment. That is, the head body 40 has a structure made up of side plates linked on the heater unit 41 and a top plate linking the two side plates.

The recognition mechanism 5 acquires position information about the chip recognition marks AC and/or the substrate recognition marks AS, which are captured by focusing through the mounting head 4 (through the attachment tool 42 and the heater unit 41). In this embodiment, the constituent elements of the recognition mechanism 5 include the image capture unit 50, an optical path 52, and an imaging means or unit 53 linked to the optical path 52. In the illustrated embodiment, the imaging means 53 includes an electronic image sensor, such as a charge-coupled device (CCD), an active-pixel sensor (CMOS sensor), and the like, for example.

The image capture unit 50 is disposed at the upper part of the recognition target from which the imaging means 53 acquires an image, and keeps the recognition target within the field of view. In the illustrated embodiment, the image capture unit 50 forms an objective, and includes an optical element, such as a lens or mirror, or combinations of several optical elements, for example. In the illustrated embodiment, the image capture unit 50 includes a reflecting means or unit 500 formed by a mirror or prism, for example.

Also, the recognition mechanism 5 is configured to be able to be moved in the in-plane direction of the substrate S (and the chip component C) within the head space 40V by a drive mechanism (not shown). Furthermore, the recognition mechanism is preferably able to move in a direction perpendicular to the substrate S (Z direction) so that the focal position can be adjusted.

The mounting head 4 is moved perpendicular to the substrate S by the elevating and pressing unit 3, and this operation can be performed independently of the operation of the recognition mechanism 5. Therefore, the head space 40V must be designed in a size such that the recognition mechanism 5 entering the head space 40V will not interfere even if the mounting head 4 moves in the vertical direction.

The movable range of the image capture unit 50 of the recognition mechanism 5 is not limited to being within the head space 40V, and is also capable of acquiring position information about the substrate recognition marks AS by moving out of the head space 40V and over the substrate S.

The chip conveyance means or unit 6 includes a conveyor that is formed by a conveyance rail 60 and a chip slider 61, and is means in which the chip slider 61 holds the chip component C supplied from a chip supply unit (not shown) and slides it to directly under the attachment tool 42.

Here, the chip supply unit (not shown) places the chip component C at a set position on the chip slider 61. If necessary, the position where the chip component C placed on the chip slider 61 may be recognized by a recognition mechanism (not shown). Thus controlling the positions of the chip slider 61 and the chip component C placed on the chip slider 61 allows the chip component C to be transferred within a specific range of the attachment tool 42. Once the attachment tool 42 is holding the chip component C, the chip slider 61 that has released the chip component C moves to its retracted position.

Figure 3:
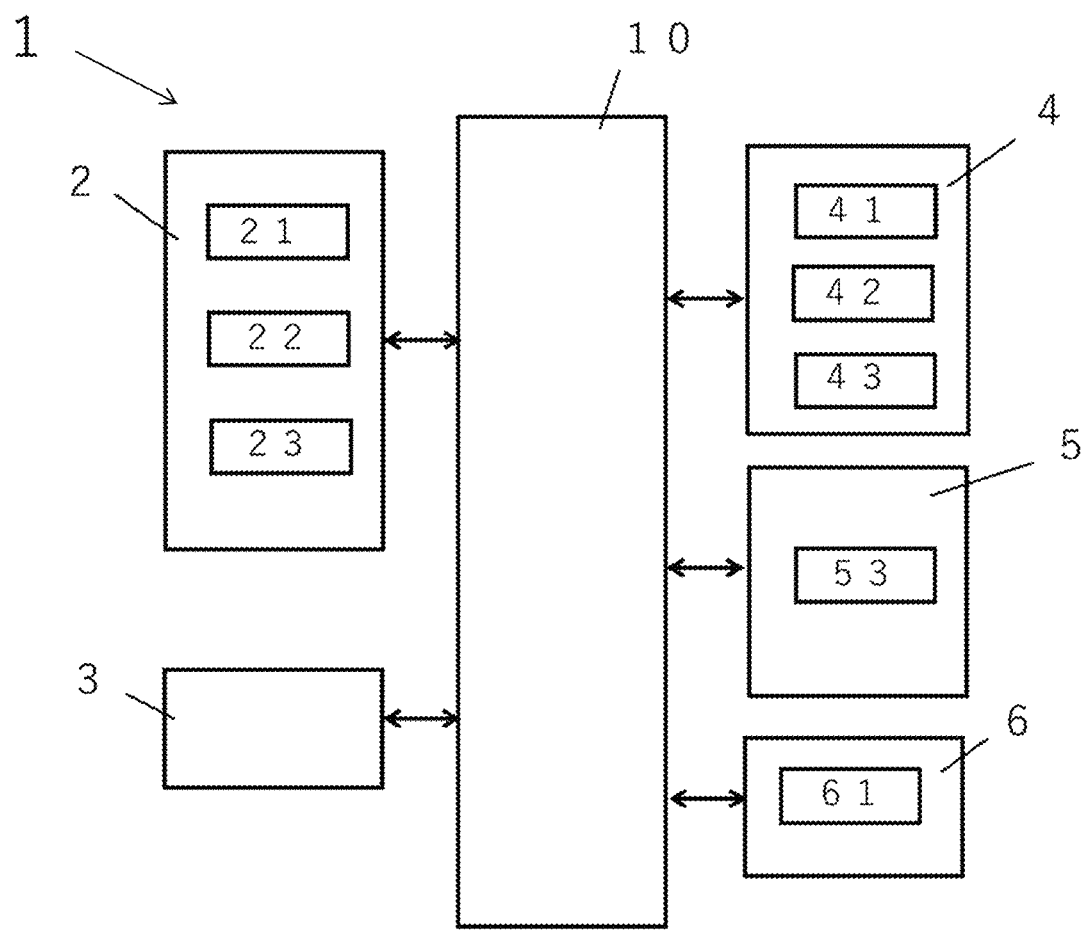
FIG. 3 is a block diagram of a control system of the mounting device according to the embodiment of the present disclosure.

As shown in the block diagram of FIG. 3, the mounting device 1 comprises the substrate stage 2, the elevating and pressing unit 3, the mounting head 4, the recognition mechanism 5, and a control unit or electronic controller 10 connected to the chip conveyance means 6.

In basic terms, the main constituent elements of the control unit 10 include at least one processor having a CPU (Central Processing Unit) and a storage device or computer memory, and an interface for each device is included as necessary. Also, the control unit 10 can have a built-in program to perform calculation using acquired data and to output according to the calculation result. Furthermore, it is preferable to have a function of recording acquired data and calculation results and use them as new data for calculation.

The control unit 10 is connected to the substrate stage 2 and controls the operations of the X direction stage movement control means 21 and the Y direction stage movement control means 22, and thereby control the in-plane movement of the suction table 23. Also, the control unit 10 controls the suction table 23 to control the application and release of suction to and from the substrate S.

The control unit 10 is connected to the elevating and pressing unit 3, controls the position of the mounting head 4 in the up and down direction (Z direction), and has the function of controlling the pressure applied when the chip component C is pressure-bonded to the substrate S.

The control unit 10 is connected to the mounting head 4, and has the function of controlling the application and release of suction to and from the chip component C by the attachment tool 42, the heating temperature of the heater unit 41, and the position within the XY plane of the head body 40 (and the heater unit 41 and the attachment tool 42), by using the tool position control means 43.

The control unit 10 is connected to the recognition mechanism 5, controls drive in the horizontal (in the XY plane) direction and the vertical direction (Z direction), and has a function of controlling the imaging means 53 to acquire image data. Furthermore, the control unit 10 has an image processing function, and has a function of calculating the positions of the chip recognition marks AC and/or the substrate recognition marks AS from an image acquired by the imaging means 53.

The control unit 10 is connected to the chip conveyance means 6, and has a function of controlling the position of the chip slider 61 that moves along the conveyance rail 60.

Figure 4:
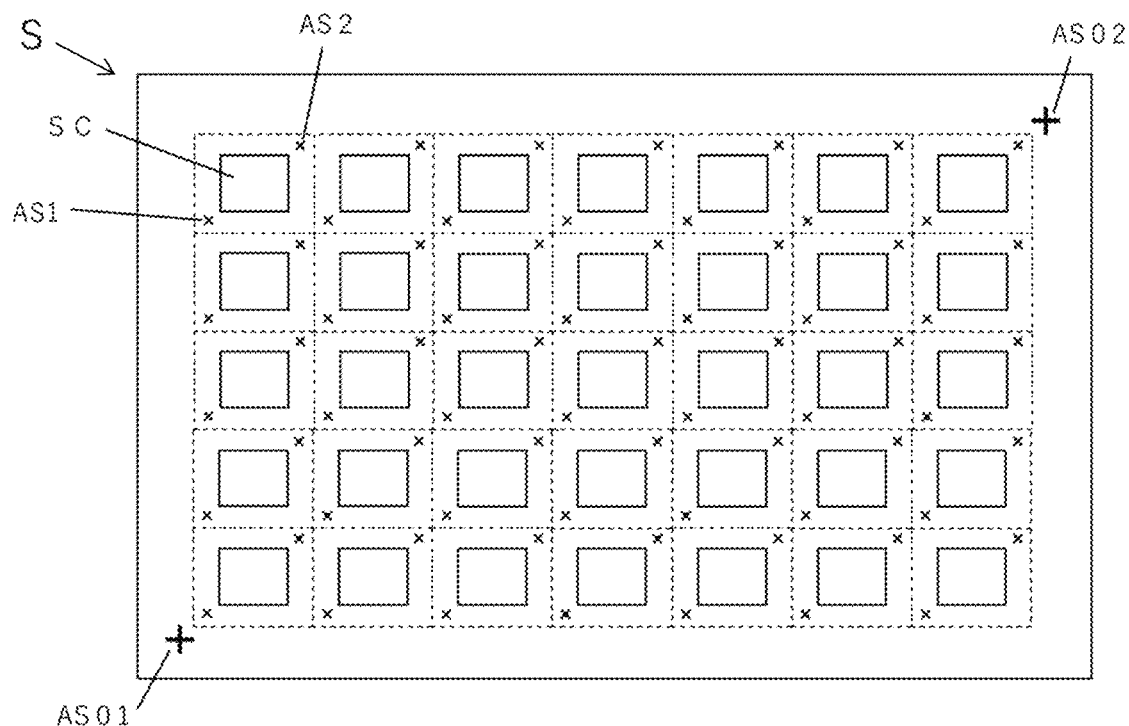
FIG. 4 is a diagram illustrating the mounting locations where individual chip components are mounted on a substrate on which a plurality of chip components are mounted, and individual substrate recognition marks.

The steps up to when the mounting device 1 mounts the chip component C on the substrate S will be described below, but FIG. 4 shows an example of the substrate S involved in the embodiment of the present disclosure. As shown in FIG. 4, the substrate S has a plurality of mounting locations SC, each of which is provided with a first substrate recognition mark AS1 and a second substrate recognition mark AS2. Also, a first substrate reference mark AS01 and a second substrate reference mark AS02 may be provided as reference marks (substrate reference marks AS0) for checking the placement of the entire substrate, and the individual mounting locations SC (and substrate recognition marks AS) are disposed very accurately with respect to the reference marks.

Figure 5:
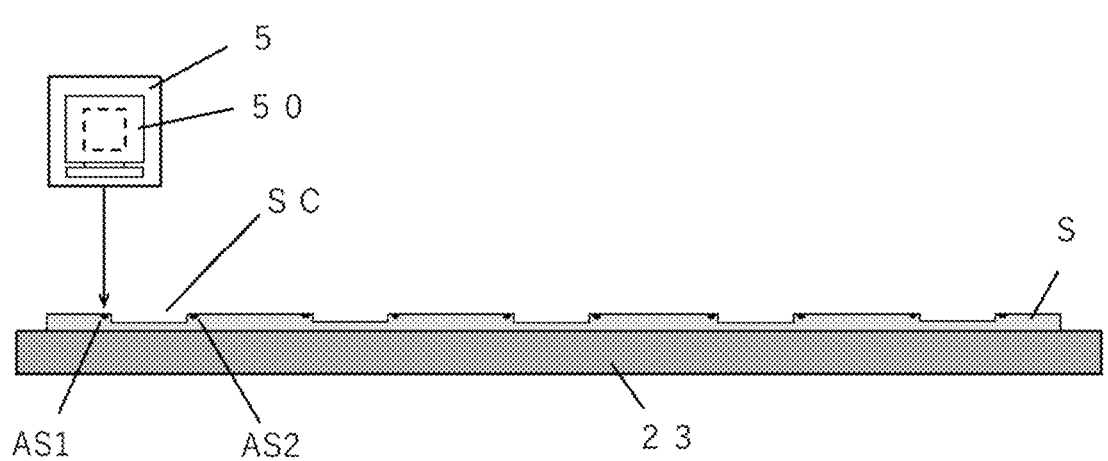
FIG. 5 is a diagram showing an example in which position information is acquired about individual substrate recognition marks of a substrate on which a plurality of chip components are mounted.

For this substrate S, the control unit 10 of the mounting device 1 has the function of calculating and storing position information about the mounting locations SC on the substrate S placed on the suction table 23. An example of this is shown in FIG. 5, and shows how the suction table 23 holding the substrate S is moved by the stage movement control means 20, while the substrate recognition marks AS disposed on the substrate S are imaged by the recognition mechanism 5 to acquire position information, and the position information for each mounting location SC is calculated and stored. Also, when the first substrate reference mark AS01 and the second substrate reference mark AS02 are provided, the controller 10 stores a map of the mounting locations SC on the substrate S in advance so that position information about the mounting locations SC within the substrate S can be calculated from the position information acquired by recognizing the first substrate reference mark AS01 and the second substrate reference mark AS02, and this information then stored. Furthermore, an example was described in which the substrate S was moved by the stage movement control means 20 in recognizing the substrate recognition marks AS or the substrate reference mark AS0, but the recognition mechanism 5 may be moved instead.

Once position information about the mounting locations SC arranged on the suction table 23 has been obtained as described above, the chip components C are mounted at the mounting locations SC.

The step of mounting the chip components C at the individual mounting locations SC with the mounting device 1 will be described below with reference to the drawings, but this description will focus on just one mounting location SC of the substrate S.

Figure 6A:
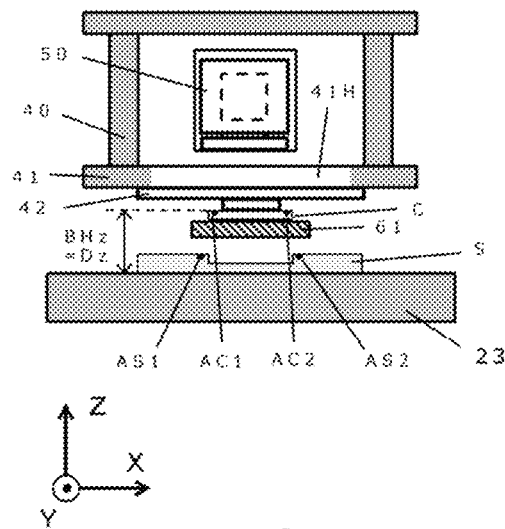
FIG. 6A is a diagram showing a state in which the mounting device according to the embodiment of the present disclosure transfers a chip component from a chip slider to an attachment tool.
Figure 6B:
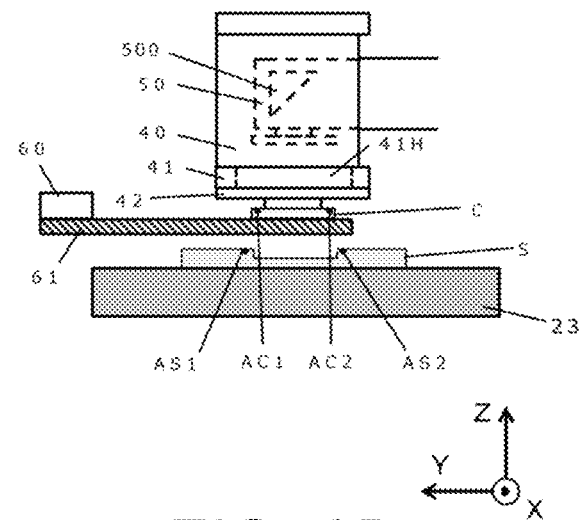
FIG. 6B is a side view of the same state.

FIGS. 6A and 6B show a mounting preparation step in which the attachment tool 42 of the mounting head 4 holds the chip component C, and the mounting location SC where mounting the next chip component C will be placed on the substrate S is disposed directly under the mounting head 4. In this mounting preparation step, it is preferable to increase the positional accuracy of the chip component C held by the attachment tool 42 and the positional accuracy of the mounting location SC in order to shorten how long the subsequent steps take.

Accordingly, it is preferable to employ a mechanism that disposes the chip components C at specific positions on the chip slider 61 from the chip supply unit (not shown) with high accuracy, and conveys the chip slider 61 with the chip conveyance means 6 with high accuracy. Also, in order to dispose the mounting locations SC on the substrate S directly under the mounting head 4 with high accuracy, it is preferable to employ the stage movement control means 20 that accurately controls the position of the suction table 23 on the basis of previously obtained position information about each of the mounting locations SC.

In the mounting preparation step, the mounting location SC on the substrate S is disposed directly under the mounting head 4 with high accuracy. Therefore, in the subsequent preliminary alignment step, only position information about the chip component C is obtained by the recognition mechanism 5, on the assumption that the mounting location SC of the substrate S is within a specific range directly under the mounting head 4.

Figure 7A:
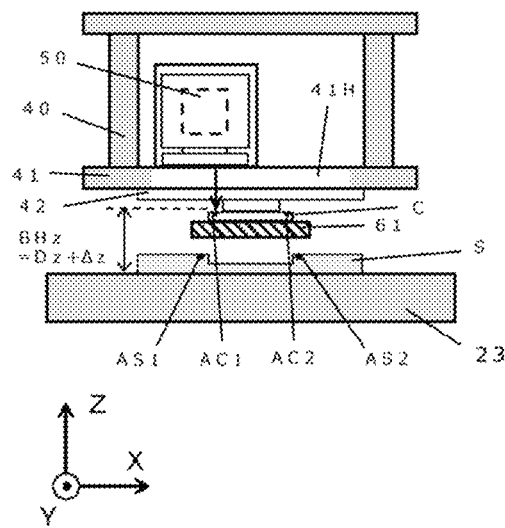
FIGS. 7A and 7B are diagrams illustrating a preliminary alignment step performed in the mounting device according to the embodiment of the present disclosure, with FIG. 7A being a diagram showing a state in which position information about the first chip recognition mark is acquired immediately after the chip component is transferred from the chip slider to the attachment tool.
Figure 7B:
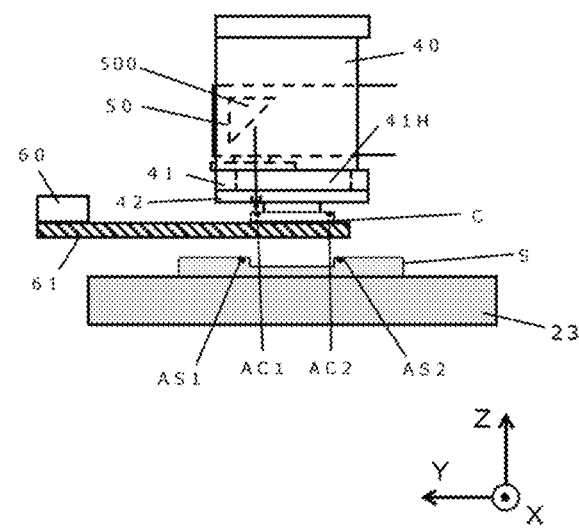

FIGS. 7A and 7B illustrate the preliminary alignment step, in which a gap is provided away from the lower surface of the chip component C when the chip slider 61 is retracted. Therefore, the mounting head 4 is raised slightly in the preliminary alignment step. That is, if we let the mounting head height BHZ be the (vertical) distance to the lower surface of the attachment tool 42 of the mounting head 4 using the surface of the suction table 23 as a reference, the mounting head height BHZ in the preliminary alignment step is increased by $\Delta z$ from Dz in the mounting preparation step, giving $Dz+\Delta z$. Here, $\Delta z$ is the necessary and minimum distance that the chip slider 61 can be retracted without interfering with the lower surface of the chip component C, and is about 1 mm or more and 2 mm or less. If there is a function of raising the chip component C to the chip slider 61 side and transferring it to the attachment tool 42, then $\Delta z$ may be zero.

Figure 8:
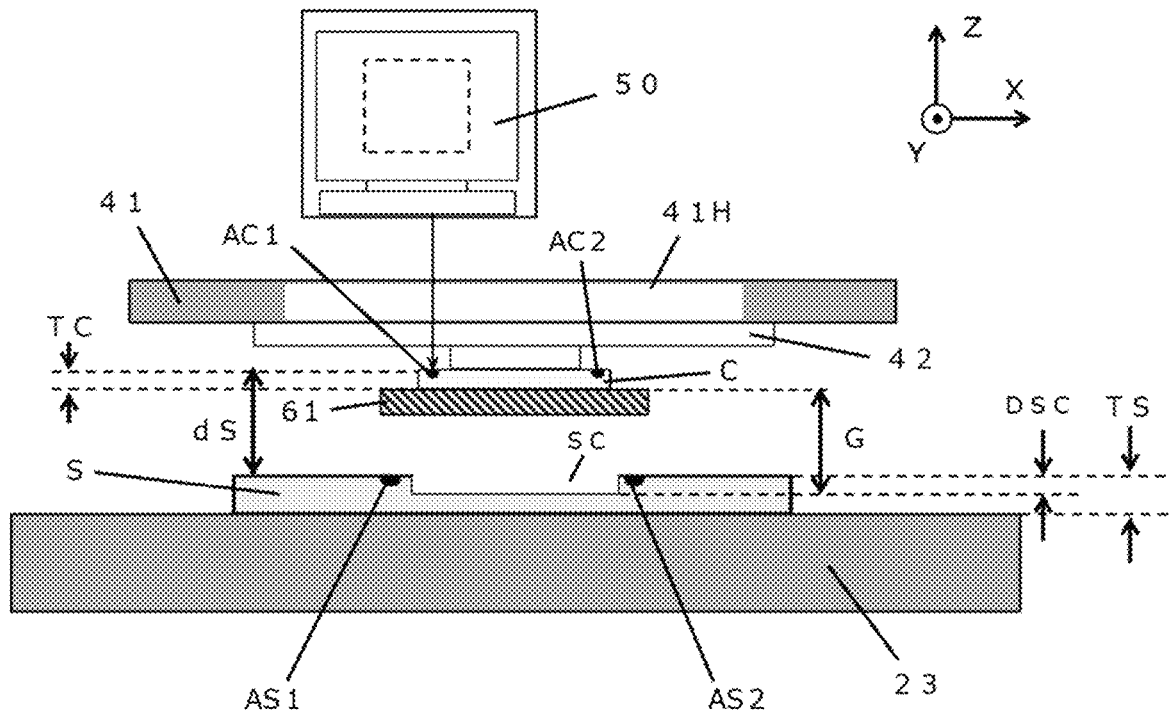
FIG. 8 is a detail view of a state in which position information about the first chip recognition mark is acquired in the preliminary alignment step performed in the mounting device according to the embodiment of the present disclosure.
Figures 9A, 9B:
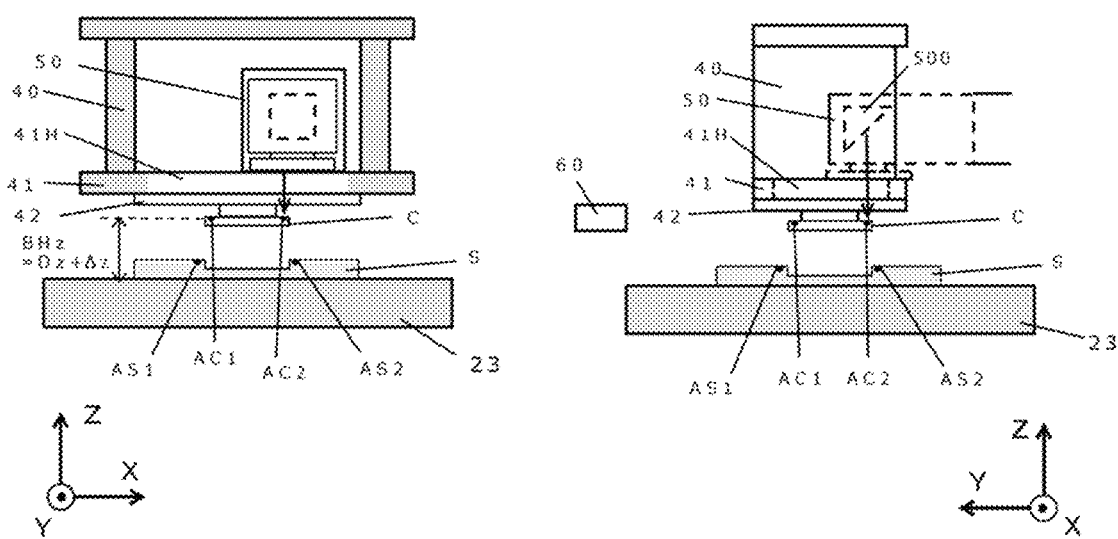
FIGS. 9A and 9B illustrate the preliminary alignment step performed in the mounting device according to the embodiment of the present disclosure, with FIG. 9A being a diagram showing a state in which position information about the second chip recognition mark is acquired while the chip slider is retracted, and FIG. 9B a diagram of the same state as viewed from the side.

As shown in FIG. 8, the preliminary alignment step is performed in a state in which the chip component C is held by the attachment tool 42, but since only the chip recognition marks AC are observed by the recognition mechanism 5, position information about the chip component C can be obtained even when the chip slider 61 is in the midst of retracting. In recognizing the chip recognition marks AC by the recognition mechanism 5, the second chip recognition marks AC2 are recognized after the first chip recognition marks AC1 are recognized. Therefore, as shown in FIGS. 9A and 9B, the recognition mechanism 5 is moved within the XY plane so that the image capture unit 50 is aligned. FIGS. 9A and 9B show an example in which the chip slider 61 is retracted at the stage of recognizing a second chip recognition mark AC2.

Figure 10A:
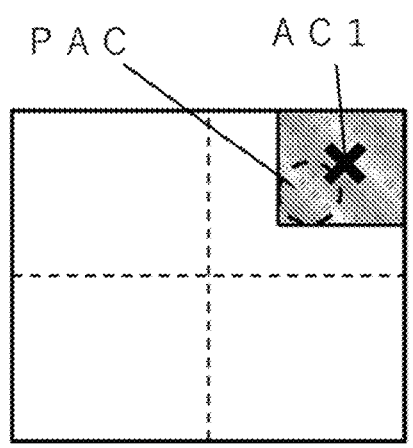
FIGS. 10A and 10B are diagrams showing a state in which position information about the first chip recognition mark is acquired in the preliminary alignment step in the embodiment of the present disclosure, with FIG. 10A being a diagram showing a state in which the amount of positional deviation exceeds the allowable range, and FIG. 10B a diagram showing a state in which the amount of positional deviation is within the allowable range.
Figure 10B:
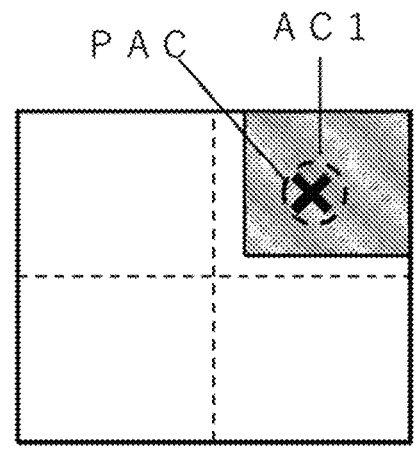

In this embodiment, at the stage of the preliminary alignment step, the mounting location SC for the next mounting is disposed directly under the bonding head 4 within a specific accuracy, based on position information about the mounting location SC acquired in advance. Therefore, it is also possible to define the allowable range PAC in which the chip recognition marks AC of the chip component C should be positioned. FIGS. 10A and 10B show the relation between the first chip recognition mark AC1 acquired by the imaging means 53 of the recognition means 5 and the permissible range PAC within which the first chip recognition mark AC should be positioned.

Here, as shown in FIG. 10B, if the center position of the first chip recognition mark AC1 is within the allowable range PAC, and the center position of the second chip recognition mark AC2 is also within the allowable range PAC (and if the chip slider 61 is in its retracted state), the flow proceeds to the next step.

On the other hand, as shown in FIG. 10A, if the center position of the first chip recognition mark AC1 is outside the allowable range PAC, position information about the center of the second chip recognition mark AC2 is also acquired, the amount of correction movement of the substrate S and the chip component C within the substrate plane for correcting the positional deviation of the chip component C with respect to the mounting location SC is calculated, and the XY in-plane position of the attachment tool 42 or "the recognition mechanism 5 and the suction table 23 (whose relative position is fixed)" is adjusted, so that the first chip recognition mark AC1 falls within the allowable range PAC as shown in FIG. 10B. Here, since moving the attachment tool 42 rather than the suction table 23 usually results in a lower weight load, it is preferable to adjust the position on the mounting head 4 side in the preliminary alignment.

Figure 11A:
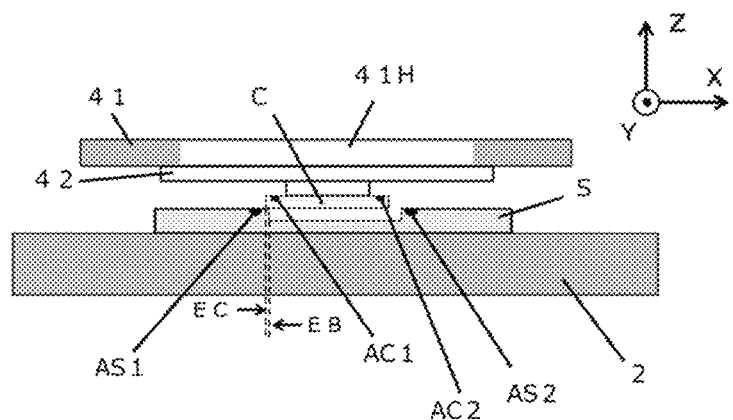
FIGS. 11A and 11B illustrate the necessity of the preliminary alignment according to the embodiment of the present disclosure, with FIG. 11A being a diagram showing a state in which a chip component sticks out from the opening of a concave component of an embedded substrate, and FIG. 11B a diagram showing a state in which the chip component is about to be embedded in the concave portion of the substrate in the same state.
Figure 11B:
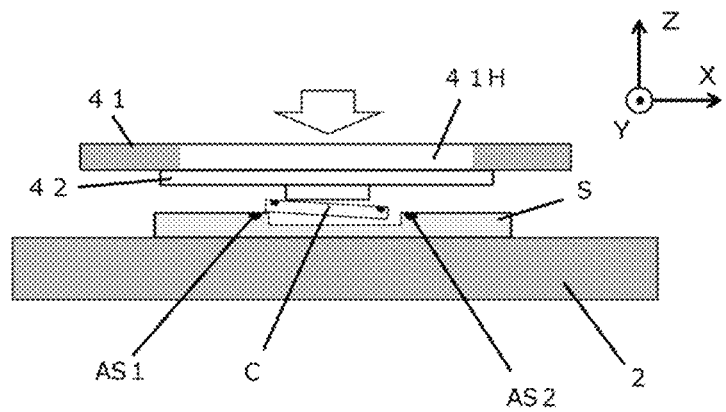

Incidentally, the preliminary alignment step is important when mounting chip components in an embedded substrate (substrate with built-in components) as shown in FIGS. 27A and 27B. That is, in many cases, there is no margin in the opening surface area of the concave component with respect to the mounting location SC, and if the mounting head 4 is lowered in a state in which the outer edge EC of the chip component C is to the outside of the edge EB of the concave portion, as shown in FIG. 11A, the chip component C will come into contact with the substrate S surface to the outside of the concave portion, and if an attempt is made to further lower the mounting head 4 to the height at which precision alignment (discussed below) will be performed (FIG. 11B), this will result in damage to the chip component C or other such problems.

After the preliminary alignment step, the mounting head 4 is lowered by the elevating and pressing unit 3 in the head lowering step. The chip component C is brought as close to the substrate S as possible without making contact, and then stopped. In this head lowering step, it is preferable for the vertical distance dS between the upper surface of the chip component C having the first chip recognition mark AC1 (and the second chip recognition mark AC2) and the upper surface of the substrate S having the first substrate recognition mark AS1 (and the second substrate recognition mark AS2) to be within the depth of field of the recognition mechanism 5. In view of this, the condition that the vertical distance dS shall be within the depth of field of the recognition mechanism 5 is discussed below.

First, the relation between the vertical distance dS shown in FIG. 8, the distance (gap) G to the joint surface where the chip component C is mounted on the substrate S, the thickness TC of the chip component C, and the depth DSC of the concave portion of the substrate S can be expressed by the following equation (1).

$$dS = G + TC - DSC \quad (1)$$

Here, "+TC−DSC" is less than the thickness TC of the chip component C, which is usually 100 μm or less, and is a few tens of microns or less. Furthermore, when the chip component C is completely embedded in the substrate S, this value becomes zero or less. Therefore, if the descent of the mounting head 4 can be stopped just before the chip component C makes contact with the bottom surface of the concave portion of the substrate S, allowing the gap G to be made smaller, then the first chip recognition mark AC1 and the first substrate recognition mark AS1 (or the second chip recognition mark AC2 and the second substrate recognition marks AS2) can fit within the depth of field.

As for the specific distance of the gap G that satisfies this condition, equation (1) shows that:

$$G=dS-(TC-DSC)=dS+DSC-TC \quad (2)$$

and in the relation to the depth of field DOF, $$dS \leq DOF \quad (3)$$

and therefore it is necessary to meet the following condition:

$$0<G \leq DOF+DSC-TC \quad (4)$$

In view of this, the control unit 10 of the mounting device 1 measures the surface height of the stage 2 (or the surface height of the substrate S) and the height of the mounting head 4 with a displacement sensor 7 (e.g., a length measurement means or unit) (FIG. 1), uses the thickness TC of the chip component, the thickness TS of the substrate S, the depth DSC of the concave component, or other such design values to calculate the gap G, and stops the descent of the mounting head 4 at a height that satisfies the condition of equation (4). In equation (4), the gap G is set to a value greater than zero, but is preferably at least several microns for the sake of the relative movement of the chip component C and the substrate S for alignment purposes. Also, since there is some variance in the actual values of the thickness TC of the chip component C, the thickness TS of the substrate S, the thickness of the thermosetting adhesive, and the depth DSC of the concave component from the design values, the variance in these values should also be taken into account. Here, the displacement sensor 7 preferably finds the vertical distance of the substrate S surface with respect to (the lower surface of the attachment tool 42 of) the bonding head 4, and to this end, it is preferably fixed to the bonding head 4, as shown in FIG. 1, but this is not the only option, and it may instead be fixed to the image capture unit 50 or the like.

Figure 12A:
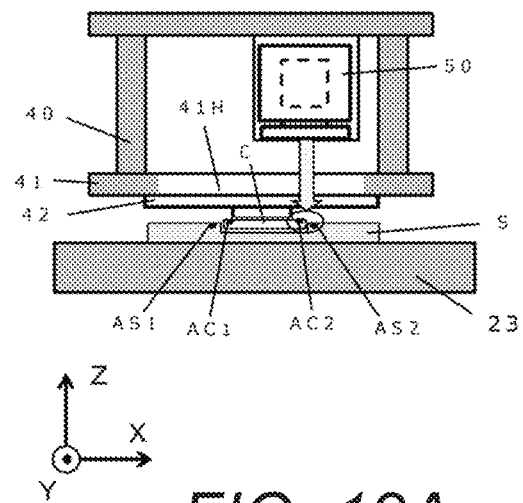
FIGS. 12A and 12B illustrate a precision alignment step performed by using the mounting device according to the embodiment of the present disclosure, with FIG. 12A being a diagram showing a state in which position information about the second substrate recognition mark and position information about the second chip recognition mark are simultaneously acquired within the same field of view, and FIG. 12B a diagram of the same state as viewed from the side.
Figure 12B:
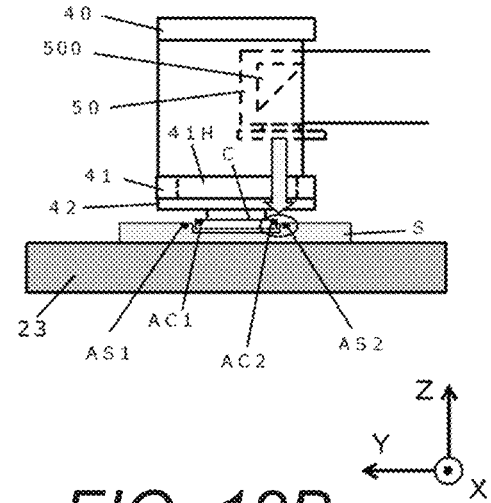

The head lowering step is followed by the precision alignment step, which will be described with reference to FIGS. 12A, 12B, 13A, 13B, 14, and 15. Here, FIGS. 12A and 12B show a state in which position information about the second substrate recognition marks AS2 and the second chip recognition marks AC2 are acquired in a state in which the head has been lowered after preliminary alignment was performed in the state in FIGS. 9A and 9B. After this, the control unit 10 controls a drive means or unit of the recognition mechanism 5, such as an electronic actuator or motor, to move the recognition mechanism 5 to the state shown in FIGS. 13A and 13B, and position information about the first substrate recognition marks AS1 and the first chip recognition marks AC1 is acquired. FIG. 14 is a detail view of FIG. 13A.

In the precision alignment step, the first substrate recognition marks AS1 and the first chip recognition marks AC1 (and the second substrate recognition marks AS2 and the second chip recognition marks AC2) can be simultaneously imaged within the depth of field DOF. To describe this using FIG. 14, the gap G is such that the vertical distance dS between the upper surface of the chip component C having the first chip recognition mark AC1 and the upper surface of the substrate S having the first board recognition mark AS1 are equal to or less than the depth of field DOF of the imaging means 53.

Figure 15:
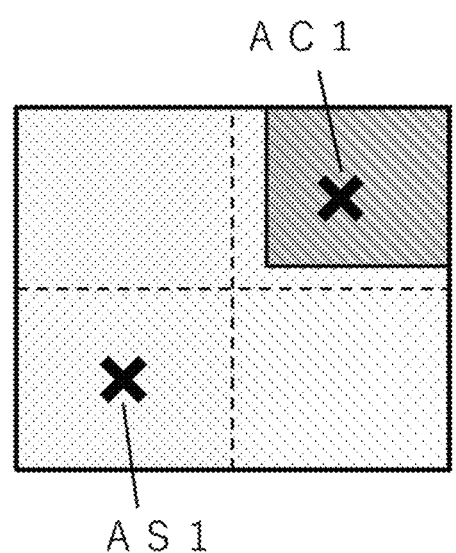
FIG. 15 is a diagram showing an example of an image produced by the imaging means, in which position information about the first substrate recognition mark and position information about the first chip recognition mark are simultaneously acquired within the same field of view in a precision alignment step performed using the mounting device according to an embodiment of the present invention.

Therefore, as shown in FIG. 15, the imaging means 53 can clearly image both the first substrate recognition mark AS1 and the first chip recognition mark AC1.

Similarly, in the state in FIGS. 12A and 12B, since both the second substrate recognition mark AS2 and the second chip recognition mark AC2 are clearly imaged by the imaging means 53, the relative positions of the second substrate recognition mark AS2 and the second recognition mark AC2 can be known accurately.

Figure 13A:
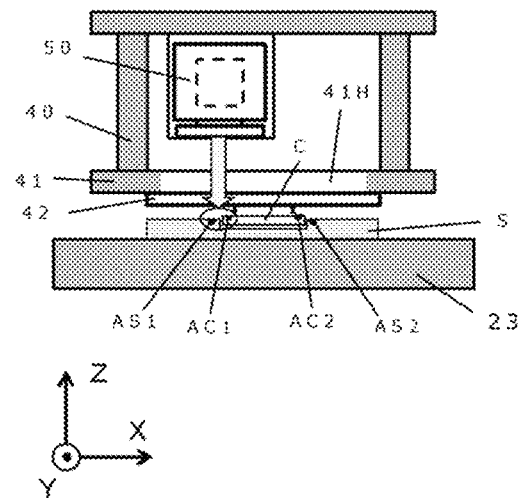
FIGS. 13A and 13B illustrate a precision alignment step performed by using the mounting device according to the embodiment of the present disclosure, with FIG. 13A being a diagram showing a state in which position information about the first substrate recognition mark and position information about the first chip recognition mark are simultaneously acquired within the same field of view, and FIG. 13B a diagram of the same state as viewed from the side.
Figure 13B:
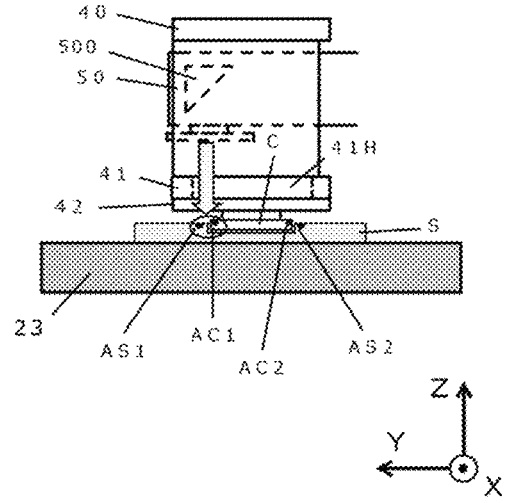
Figure 14:
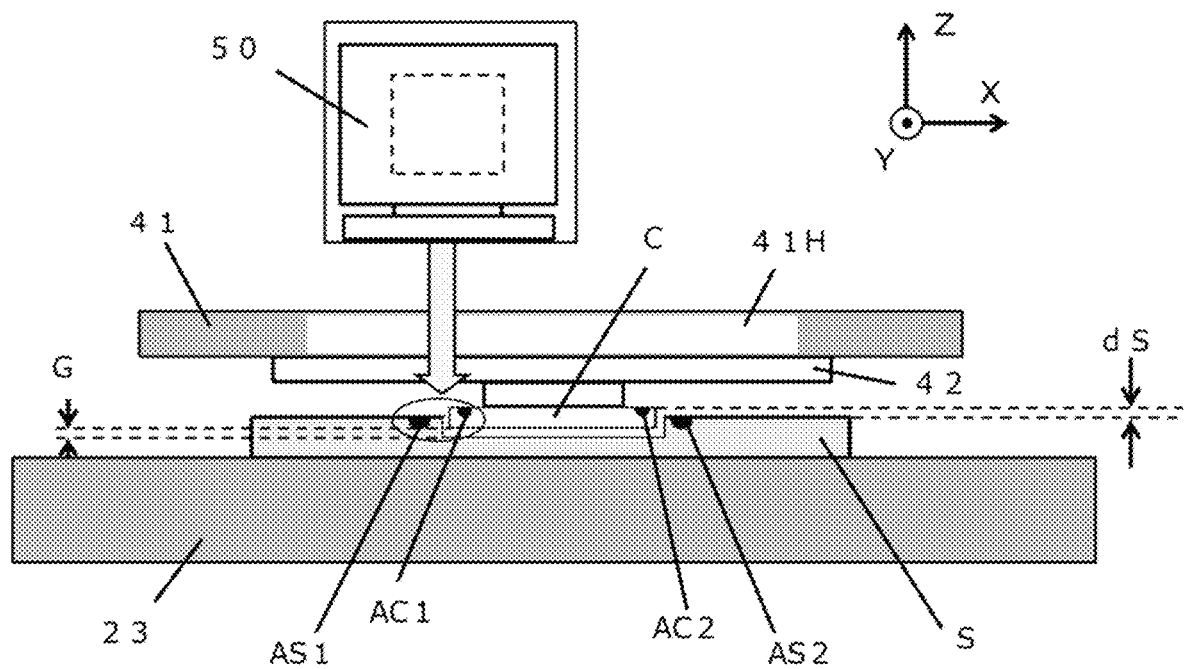
FIG. 14 is a detail view of a state in which position information about the first substrate recognition mark and position information about the first chip recognition mark are simultaneously acquired within the same field of view in a precision alignment step performed using the mounting device according to an embodiment of the present invention.

After this, the relative position information about the first substrate recognition mark AS1 and the first chip recognition mark AC1 obtained in the state of FIGS. 13A and 13B, and the relative position information about the second substrate recognition mark AS2 and the second chip recognition mark AC2 obtained in the state of FIGS. 12A and 12B are used to align the substrate S and the chip component C. That is, first, the control unit 10 calculates the amount of positional deviation between the substrate S and the chip component C from the relative position information about the first substrate recognition mark AS1 and the first chip recognition mark AC1 and the relative position information about the second substrate recognition mark AS2 and the second chip recognition mark AC2. Then, the correction movement amount of the substrate S and the chip component C within the substrate plane for correcting this positional deviation amount is calculated, the substrate stage 2 and/or the mounting head 4 is driven within the substrate plane (in the XY and θ directions) under control by the control unit 10, and precision alignment is performed so that the amount of positional deviation between the substrate S and the chip component C falls within the allowable range.

Figure 16A:
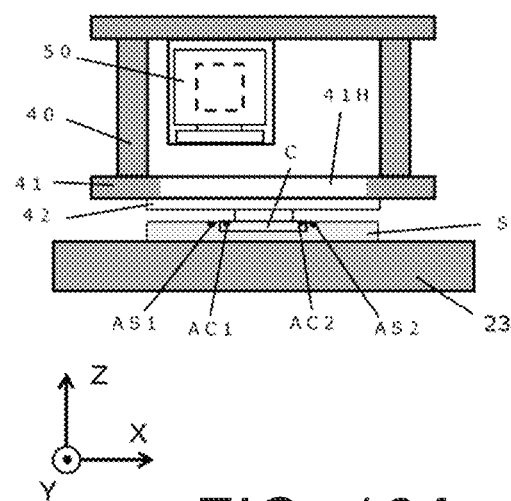
FIGS. 16A and 16B illustrate a pressure-bonding step performed by the mounting device according to the embodiment of the present disclosure, with FIG. 16A being a diagram showing a state in which the chip component is brought into close contact with and joined to the substrate, and FIG. 16B a diagram of the same state as viewed from the side.
Figure 16B:
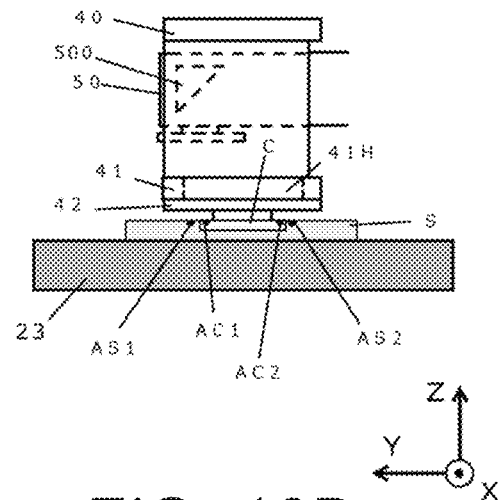
Figure 17A:
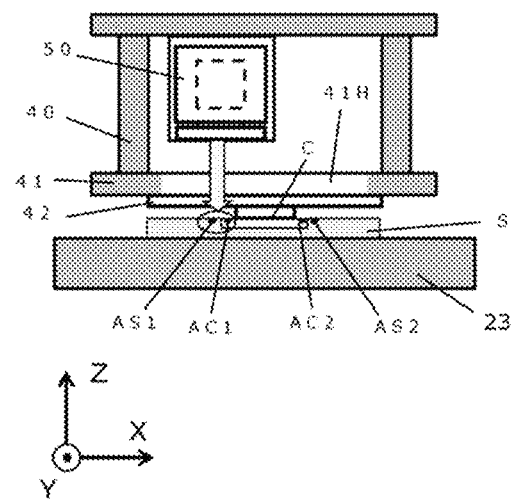
FIGS. 17A and 17B illustrate mounting location accuracy measurement in the pressure-bonding step performed by the mounting device according to the embodiment of the present disclosure, with FIG. 17A being a diagram showing a state in which position information about the first substrate recognition mark and position information about the first chip recognition mark are simultaneously acquired within the same field of view, and FIG. 17B a diagram of the same state as viewed from the side.
Figure 17B:
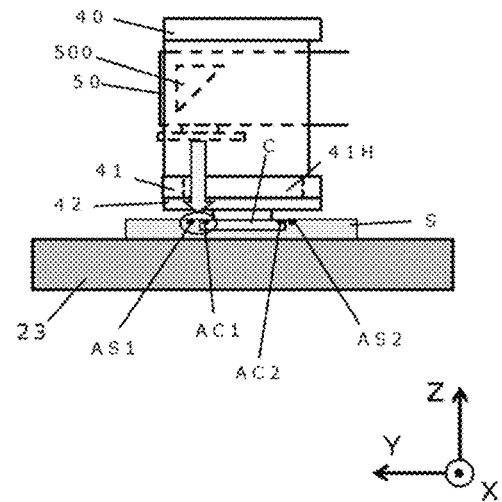
Figure 18A:
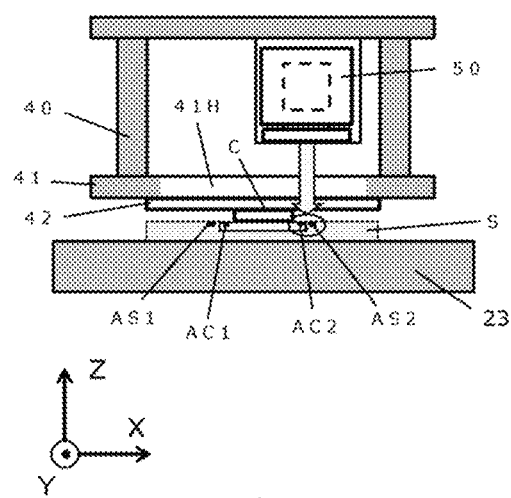
FIGS. 18A and 18B illustrate mounting location accuracy measurement in the pressure-bonding step performed by the mounting device according to the embodiment of the present disclosure, with FIG. 18A being a diagram showing a state in which position information about the second substrate recognition mark and position information about the second chip recognition mark are simultaneously acquired within the same field of view, and FIG. 18B a diagram of the same state as viewed from the side.
Figure 18B:
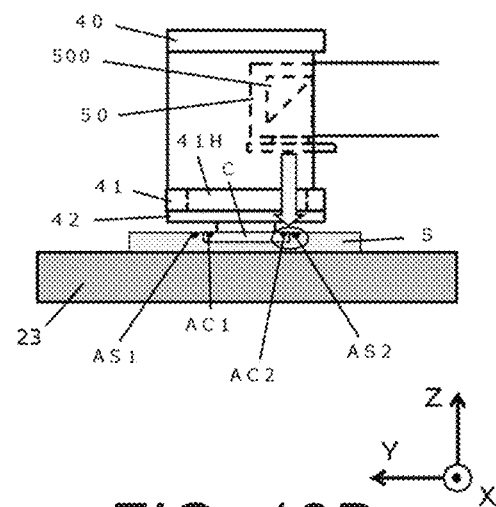

Once the precision alignment step is complete, the flow moves on to a pressure-bonding step in which the chip component C is pressure-bonded to the substrate S. In the pressure-bonding step, the control unit 10 lowers the mounting head 4 to bring the chip component C into close contact with the substrate S, and performs mounting at a specific pressure (FIGS. 16A and 16B). Here, the distance the mounting head 4 descends is the gap G, and the gap G shown in equation (7) is about several microns to several tens of microns. Therefore, the positional accuracy obtained in the alignment step is maintained in the mounting step, affording highly accurate mounting.

In the mounting step, the chip component C is fixed to the substrate S by heating the thermosetting adhesive between the substrate S and the chip component C with the heater unit 41 of the mounting head 4. After pressuring and heating have been performed for a certain length of time, the mounting head 4 releases the suction hold on the chip component C and rises, which completes the mounting step.

From the standpoint of quality control, it has become necessary to measure and inspect all of the mounting locations for accuracy after the completion of the mounting step, and with the mounting device 1 of the present disclosure, this measurement of all the mounting locations for accuracy can be performed without raising the cost. That is, if the acquisition of relative position information about the first substrate recognition marks AS1 and the first chip recognition marks AC1 performed in FIGS. 13A and 13B and the acquisition of relative position information about the second substrate recognition marks AS2 and the second chip recognition marks AC2 performed in FIGS. 12A and 12B are performed in the pressure-bonding step shown in FIGS. 17A, 17B, 18A and 18B, then position information about each chip component C with respect to the substrate S in the pressure-bonding step, that is, the mounting accuracy, can be obtained. Moreover, if the time required for pressure-bonding in the pressure-bonding step is longer than the time required for position information acquisition, then mounting location accuracy measurement can be performed within the time required for the pressure-bonding step, without affecting the mounting takt time.

After pressing for a certain length of time, the pressure-bonding step is ended, and if there is another chip component C to be mounted, the mounting preparation step is commenced.

The above is the series of mounting steps in this embodiment. In this embodiment, if "the place where the next chip component C is to be mounted" on the substrate S and the chip component C are disposed with high accuracy before the preliminary alignment step, the tool position control means 43 will not be operated often in the preliminary alignment step, and basically just accuracy confirmation will be performed, so the takt time is shortened and the result is a mounting device with excellent productivity. Here, if each of the constituent elements in the device is finished with high precision and the positional deviation does not deviate from the allowable range as long as there is no abnormality in any of the mechanisms, then just device troubleshooting may be performed, in which case only the position information about either the first chip recognition marks AC1 or the second chip recognition marks AC2 need be acquired.

On the other hand, in order to meet the need for high precision before the preliminary alignment step, each part of the mounting device must be precision machined and precision assembled, which drives up the cost of the device. In view of this, the configuration of a mounting device that is a modification example of this embodiment, which can also handle a situation in which it is difficult to dispose "the location where the chip component C is to be mounted" and the chip component C on the substrate S with high accuracy before the preliminary alignment step, is shown in FIGS. 19A and 19B.

Figure 19A:
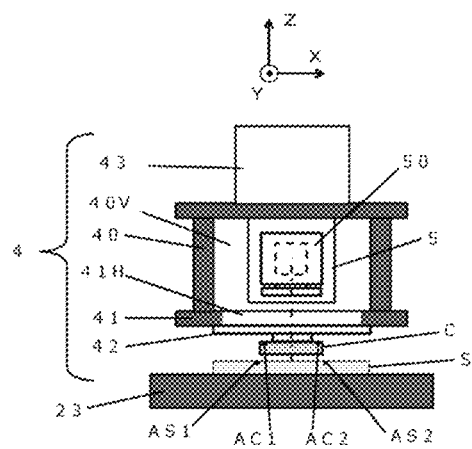
FIG. 19A is a diagram of the constituent elements of a mounting device according to a modification example of the present disclosure.
Figure 19B:
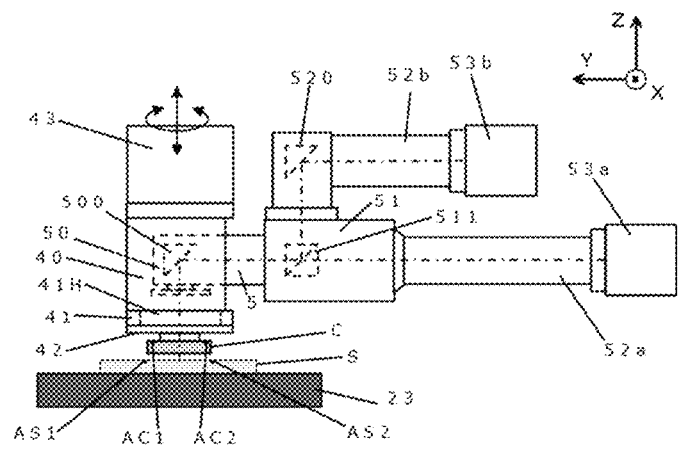
FIG. 19B is a diagram showing the constituent elements of the same mounting device as viewed from the side.

When the mounting device 1 shown in FIGS. 2A and 2B performs preliminary alignment, it is assumed that the mounting location SC of the substrate S is disposed under the mounting head 4 with at a specific accuracy, and position information about just the chip component recognition marks AC is obtained on this premise, whereas in the modification example shown in FIGS. 19A and 19B, the configuration is such that position information about the substrate recognition marks AS is also obtained during preliminary alignment.

For this reason, with the mounting device shown in FIGS. 19A and 19B, the constituent elements of the recognition mechanism 5 include the image capture unit 50, an optical system (shared) 51, an optical path 52a and an optical path 52b that branch off from the optical system 51 with a common optical axis, an imaging means or unit 53a that is linked to the optical path 52a, and an imaging means or unit 53b that is linked to the optical path 52b. In the illustrated embodiment, the imaging means 53a and the imaging means 53b each include an electronic image sensor, such as a charge-coupled device (CCD), an active-pixel sensor (CMOS sensor), and the like, for example.

Also, if "the path from the image capture unit 50 to the imaging means 53a via the optical system 51 and the optical path 52a" and "the path from the image capture unit 50 to the imaging means 53b via the optical system 51 and the optical path 52b" are provided to have different optical path lengths, in the resulting configuration the focal position of the imaging means 53a and the focal position of the imaging means 53b will be different. Here, the optical system (shared) 51 has a function of changing the direction of the optical path with a reflecting means or unit 500 and a reflecting means or unit 520, and the optical path is branched by a half mirror 511. The optical system 52a and the optical system 52b have optical elements, such as optical lenses, and may have a function of enlarging an image to obtain higher resolution. Also, in the illustrated embodiment, the reflecting means 500 and the reflecting means 520 are each formed by a mirror or prism, for example.

The preliminary alignment step in the modification example of the embodiment of the present disclosure shown in FIGS. 19A and 19B will be described below with reference to FIGS. 20A, 20B, 21A, 21B, 22, 23A and 23B. In this preliminary alignment step, the controller 10 causes the substrate stage 2 to hold the substrate S and causes the mounting head 4 to hold the chip component C. At this point, the substrate S is disposed within a specific range of the substrate stage 2, and the chip component C is held at a specific in-plane position on the lower surface of the attachment tool 42. That is, the chip component C and the substrate S are roughly aligned. Therefore, through the through-hole 41H in the heater unit 41 and the attachment tool 42, the first substrate recognition marks AS1, the second substrate recognition marks AS2, the first chip recognition marks AC1, and the second chip recognition marks AC2 can all be observed through the mounting head 4.

In the preliminary alignment step of the modification example, the substrate S and the chip component C are aligned in a state in which there is a height difference between the substrate recognition marks AS and the chip recognition marks AC, and it is difficult to keep both recognition marks within the depth of field at the same time, and the substrate recognition marks and the chip recognition marks are observed by different imaging means or unit having different focal lengths.

Here, the state in which it is difficult to keep both recognition marks within the depth of field at the same time will be described with reference to FIG. 22, which is a detail view of FIG. 20A. In the following description, the surface of the suction table 23 is used as a reference for height.

Figure 22:
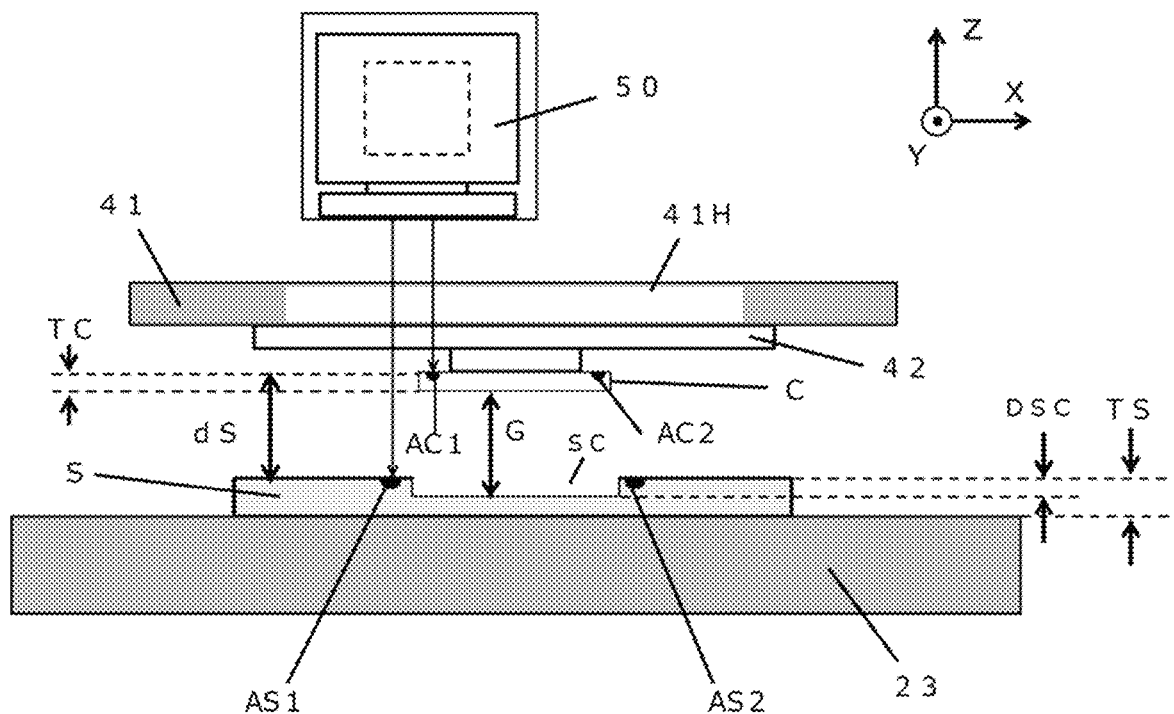
FIG. 22 is a detail view showing a state in which position information about the first substrate recognition mark and position information about the first chip recognition mark are simultaneously acquired within the same field of view in the preliminary alignment step performed in the mounting device according to the modification example of the present disclosure.

In FIG. 22, dS, which is the vertical distance between the upper surface of the chip component C having the first chip recognition mark AC1 and the upper surface of the substrate S having the first substrate recognition mark AS1, is defined as follows, in terms of the relation between the thickness TS of the substrate S and the mounting head height BHz (the height of the bottom surface of the attachment tool 42):

$$dS = BHz - TS \qquad (5)$$

Here, the mounting head height BHz in the state in FIG. 5 is higher by $\Delta z$ than the mounting head height Dz at the time of chip transfer:

$$BHz = Dz + \Delta z \qquad (6)$$

and substituting into equation (1), we obtain the following:

$$dS = Dz + \Delta z - TS \qquad (7)$$

Here, Dz is about 10 mm because it is greater than the thickness of the chip slider 61 on which the chip component C is placed, and $\Delta z$ is at least 1 mm and no more than 2 mm as mentioned above, whereas the thickness TS of the substrate S is generally no more than 2 mm, so dS is about 10 mm.

Therefore, in order to simultaneously observe the first chip recognition marks AC1 and the first substrate recognition marks AS1, the depth of field must be about 10 mm. However, it is practically impossible to set the depth of field to about 10 mm under the condition that the positions of the first chip recognition marks AC1 and the first substrate recognition marks AS1 be highly accurate, on the micron level or better.

For the above reasons, in preliminary alignment, the substrate recognition marks AS and the chip recognition marks AC are separately observed by the imaging means having different focal lengths.

Figure 20A:
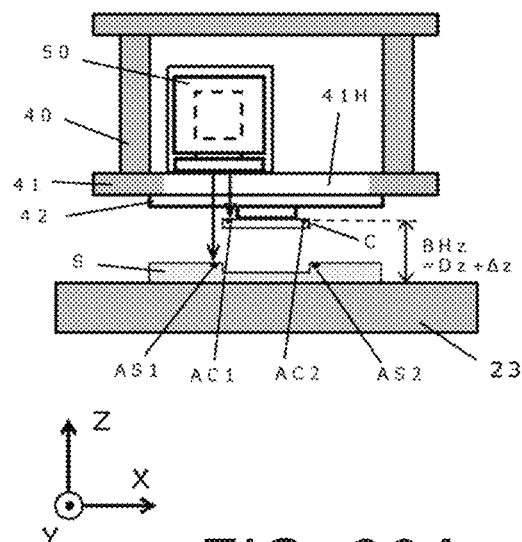
FIGS. 20A and 20B illustrate a preliminary alignment step performed in the mounting device according to the modification example of the present disclosure, with FIG. 20A being a diagram showing a state in which position information about the first substrate recognition mark and position information about the first chip recognition mark are simultaneously acquired, and FIG. 20B a diagram the same state as viewed from the side.
Figure 20B:
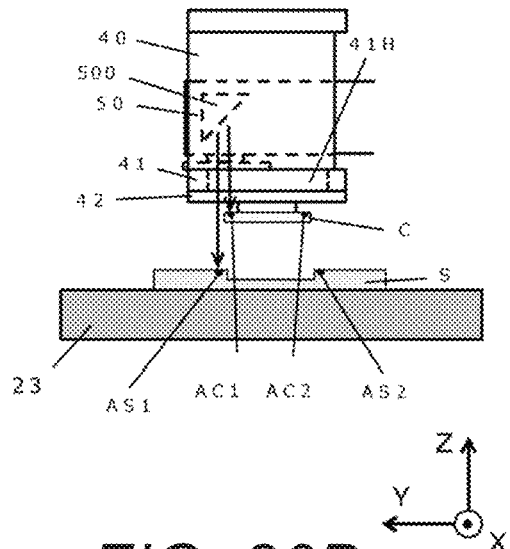

That is, in the state in FIGS. 20A and 20B (and FIG. 22) in which position information is obtained by simultaneously recognizing the first substrate recognition mark AS1 and the first chip recognition mark AC1, one of the imaging means 53a and the imaging means 53b shown in FIG. 19B focuses on the first substrate recognition mark AS1 to capture an image, and the other one focuses on the first chip recognition mark AC1 to capture an image. In the following description, an example will be given in which the imaging means 53a images the first substrate recognition mark AS1 and the imaging means 53b images the first chip recognition mark AC1. The imaging means 53a, the imaging means 53b, the optical system 52a and the optical system 52b preferably have the same specifications, such as the number of imaging elements and optical lens magnification, and the configuration is preferably such that the optical path length from the first substrate recognition mark AS1 to the imaging means 53a is equal to the optical path length from the first chip recognition mark AC1 to the imaging means 53b.

Figures 23A, 23B:
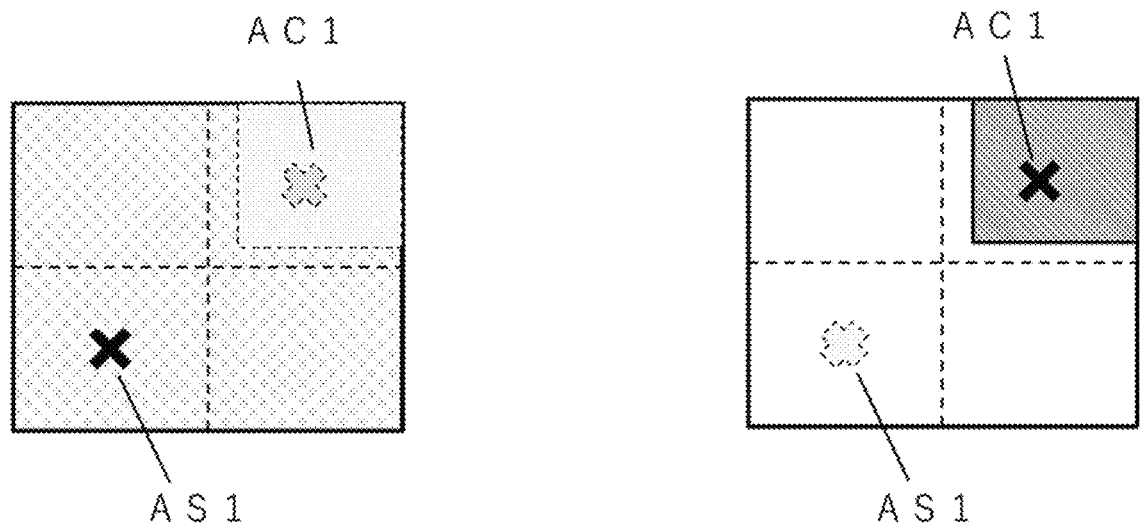
FIGS. 23A and 23B show a state in which position information about the first substrate recognition mark and position information about the first chip recognition mark are acquired simultaneously when preliminary alignment of the chip component and the substrate is performed in the preliminary alignment step performed in the mounting device according to the modification example of the present disclosure, with FIG. 23A being a diagram showing an example of an image produced by a substrate imaging means focused on the first substrate recognition mark, and FIG. 23B a diagram showing an example of an image produced by the substrate imaging means focused on the first chip recognition mark.

With this configuration, the imaging means 53a obtains an image focused on the first substrate recognition mark AS1 as shown in FIG. 23A, and the imaging means 53b obtains an image focused on the first chip recognition mark AC1 as shown in FIG. 23B. Moreover, images focused on the first substrate recognition mark AS1 and the first chip recognition mark AC1 are simultaneously obtained via a common optical axis path. Here, if the coordinate positional relationship between the images obtained by the both imaging means is clarified in advance, relative position information about the first substrate recognition mark AS1 and the first chip recognition mark AC1 can be obtained.

Figure 21A:
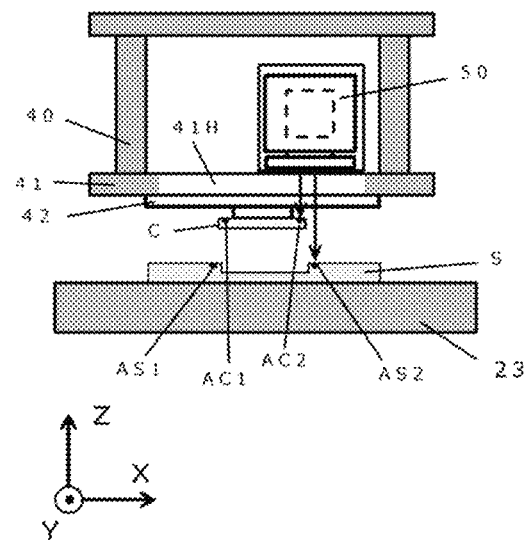
FIGS. 21A and 21B illustrate the preliminary alignment step performed in the mounting device according to the modification example of the present disclosure, with FIG. 21A being a diagram showing a state in which position information about the second substrate recognition mark and position information about the second chip recognition mark are acquired simultaneously, and FIG. 21B a diagram showing the same state as viewed from the side.
Figure 21B:
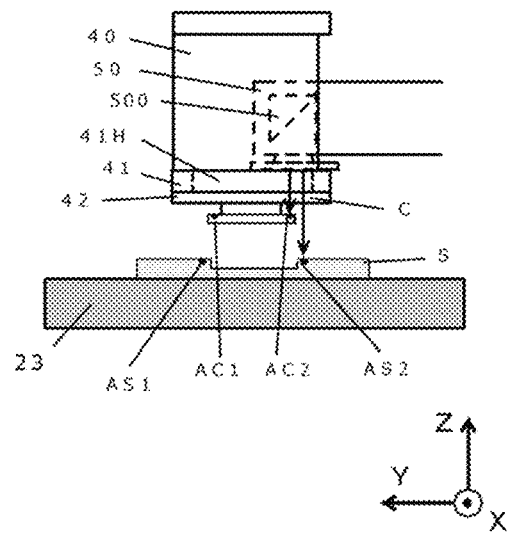

After recognizing the first substrate recognition mark AS1 and the first chip recognition mark AC1 are recognized to obtain position information in the state in FIGS. 20A and 20B, the control unit 10 controls the drive means of the recognition mechanism 5, and disposes the image capture unit 50 at a position where the second substrate recognition mark AS2 and the second chip recognition mark AC2 are within the same visual field, as shown in FIGS. 21A and 21B. At this time, if the substrate is moved in the (XY) in-plane direction, the substrate recognition mark and the chip recognition mark are kept in focus without having to adjust the position of the recognition mechanism 5 in the vertical direction (Z direction).

Thus, an image focused on the second substrate recognition mark AS12 is obtained by the imaging means 53a, and an image focused on the second chip recognition mark AC2 is obtained by the imaging means 53b. Furthermore, images focused on the first substrate recognition mark AS1 and the first chip recognition mark AC1 can be simultaneously obtained via a common optical axis path. Here, if the coordinate positional relationship between the images obtained by the both imaging means is clarified in advance, relative position information about the second substrate recognition mark AS2 and the second chip recognition mark AC2 can be obtained.

Next, relative position information about the first substrate recognition mark AS1 and the first chip recognition mark AC1 obtained in the state in FIGS. 20A and 20B, and relative position information about the second substrate recognition marks AS2 and the second chip recognition mark AC2 obtained in the state in FIGS. 21A and 21B are used to adjust the positions of the substrate S and the chip component C. That is, first, the control unit 10 calculates the amount of positional deviation between the substrate S and the chip component C from relative position information about the first substrate recognition mark AS1 and the first chip recognition mark AC1 and relative position information about the second substrate recognition mark AS2 and the second chip recognition mark AC2. Here, if the amount of positional deviation exceeds the allowable range, the amount of corrective movement of the substrate S and the chip component C within the substrate plane for correcting this positional deviation is calculated, and the substrate stage 2 and/or the mounting head is 4 is driven in the substrate plane (XY) direction to adjust the positions the substrate S and the chip component C to be within the allowable range, and the preliminary alignment is completed.

After this, the flow proceeds to the head lowering step, the precision alignment step, and the pressure-bonding step. In the precision alignment step, either the imaging means 53a or the imaging means 53b may be used as the imaging means, but the imaging means that observes the first substrate recognition mark AS1 (and the second the substrate recognition mark AS2) is preferable because there is no need to change the focus even if the mounting head 4 is lowered.

An example of performing embedded mounting as shown in FIGS. 27A and 27B is given above using the mounting device 1 of the embodiment shown in FIG. 1 or the modification example thereof (FIGS. 19A and 19B), but as shown in FIG. 24B, the present invention can also be applied to a case in which the chip component C is mounted on a mounting location SC of the substrate S having no concave portion as shown in FIG. 24B. In this case, since the mounting is not in a concave portion of the substrate S, the first substrate recognition mark AS1 and the first chip recognition mark AC1 (and the second substrate recognition mark AS2 and the second chip recognition mark AS2) need only be within the same field of view of the imaging means at the stage of the precision alignment step, so there is less need for preliminary alignment.

However, in the mounting mode shown in FIG. 25, assuming that DSC in equation (7) is zero, it is necessary to obtain a gap G that satisfies the following:

$$0 < G \leq DOF - TC \tag{8}$$

That is, this is possible in the mounting of thin chip components in which the thickness TC of the chip component C is less than the depth of field DOF. Incidentally, measurement using the displacement sensor 7 may be performed each time the mounting head 4 is lowered in the head lowering step, but the in-plane distribution of the surface height of the substrate stage 2 or the surface height of the substrate S may be ascertained in advance, and the height of the mounting head 4 may be fine-tuned in each alignment step on the basis of this height distribution. Doing this shortens the time it takes from the preliminary alignment step to the alignment step.

In addition, the in-plane distribution of the surface height of the substrate stage 2 or the surface height of the substrate S may be measured while the substrate stage 2 is moved relatively in the XY plane direction with respect to the displacement sensor 7, with the displacement sensor 7 set at a reference height. FIG. 26 shows an example of measuring the height direction (Z direction) distribution of the surface F2 of the substrate stage 2 with the displacement sensor 7, and as shown in the drawing, using the displacement sensor 7 having a constant height (Z direction), the substrate stage 2 is moved relatively in the XY direction while the Z-direction distance LZ to the surface F2 is measured.

In the above description, an example was given of applying the present invention to face-up mounting, on the assumption that the chip recognition marks were provided on the electrode surface side of the chip component C, but the present invention can also be applied to face-down mounting when using chip components in which the chip recognition marks are made on the opposite side from the electrode surface.

What is claimed is:

1. A mounting method with which a chip component having a chip recognition mark for alignment is mounted on a substrate having a substrate recognition mark for alignment in an orientation in which the chip recognition mark and the substrate recognition mark face upward, the mounting method making use of
   a substrate stage configured to hold the substrate,
   a mounting head configured to hold the chip component,
   an elevating unit configured to raise and lower the mounting head in a direction perpendicular to the substrate, and
   a recognition mechanism configured to acquire position information about the chip recognition mark and position information about the substrate recognition mark using an imaging unit, and configured to move in an in-plane direction of the substrate, and
   a chip conveyance unit having a chip slider that is configured to convey the chip component directly under the mounting head to transfer the chip component to the mounting head, the mounting method comprising:
   starting acquiring the position information about the chip recognition mark from the imaging unit after the chip component is transferred to the mounting head and before the chip slider starts retracting from directly under the mounting head;
   bringing the chip component and the substrate closer with each other based on the position information about the chip recognition mark such that the imaging unit simultaneously images the chip recognition mark and the substrate recognition mark within a depth of field;
   performing precision alignment after the chip component and the substrate are brought closer with each other such that the imaging unit simultaneously images the chip recognition mark and the substrate recognition mark within the depth of field; and
   performing a pressure bonding by further lowering the mounting head after the performing of the precision alignment to bring the chip component and the substrate into close contact with each other, and by joining the chip component and the substrate.

2. The mounting method according to claim 1, further comprising
   prior to the performing of the precision alignment, recognizing the substrate recognition mark of the substrate held on the substrate stage by the imaging unit, and disposing a mounting location on the substrate where the chip component is to be mounted directly under the mounting head on the basis of position information about the substrate obtained from the imaging unit, and performing a preliminary alignment by calculating an amount of positional deviation between the chip component and the substrate from the position information about the chip recognition mark obtained from the recognition mechanism and position information about the mounting location, and by correcting the positional deviation.

3. The mounting method according to claim 2, wherein the correcting of the positional deviation including correcting the positional deviation by driving the mounting head and/or the substrate stage while the amount of the positional deviation exceeds an allowable range.

4. The mounting method according to claim 2, wherein the preliminary alignment is performed at a height of the mounting head equal to or greater than a height at which the chip component is transferred from the chip conveyance unit.

5. A mounting device with which a chip component having a chip recognition mark for alignment and a substrate having a substrate recognition mark for alignment are mounted face-up in an orientation in which the chip recognition mark and the substrate recognition mark face upward, the mounting device comprising:
   a substrate stage configured to hold the substrate;
   a mounting head configured to hold the chip component;
   an elevating unit configured to raise and lower the mounting head in a direction perpendicular to the substrate;
   a recognition mechanism having an imaging unit, the recognition mechanism being configured to recognize the chip recognition mark and the substrate recognition mark through the mounting head, from above the mounting head, and configured to move in an in-plane direction of the substrate;
   a chip conveyance unit having a chip slider that is configured to convey the chip component directly under the mounting head to transfer the chip component to the mounting head; and
   a control unit operatively connected to the recognition mechanism, the control unit being
   configured to start acquiring position information about the chip recognition mark from the imaging unit after the chip component is transferred to the mounting head and before the chip slider starts retracting from directly under the mounting head,
   configured to bring the chip component and the substrate closer with each other based on the position information about the chip recognition mark such that the imaging unit simultaneously images the chip recognition mark and the substrate recognition mark within a depth of field,
   configured to calculate an amount of positional deviation between the chip component and the substrate from the position information about the chip recognition mark and position information about the substrate recognition mark obtained from the recognition mechanism, and
   configured to perform alignment by driving the mounting head and/or the substrate stage according to the amount of the positional deviation in a state in which the imaging unit simultaneously images the chip recognition mark and the substrate recognition mark within the depth of field, after which the chip component and the substrate are brought into close contact with each other.

6. The mounting device according to claim 5, wherein the control unit is configured to recognize the substrate recognition mark of the substrate held on the substrate stage by the imaging unit and configured to store position information about a place where the chip component is to be mounted on the basis of position information about the substrate obtained from the imaging unit.

7. The mounting device according to claim 6, wherein the control unit is
configured to compare the position information about the chip recognition mark with the position information about the place where the chip component is to be mounted on the substrate, and
configured to bring the chip component and the substrate closer with each other while a comparison result is within a permissible range.

8. The mounting device according to claim 5, wherein the imaging unit of the recognition mechanism includes a chip recognition imaging unit that is configured to focus on the chip recognition mark and a substrate recognition imaging unit that is configured to focus on the substrate recognition mark, the chip recognition imaging unit and the substrate recognition imaging unit being provided to branched optical paths having a shared optical axis.

9. The mounting device according to claim 8, wherein the chip component and the substrate are brought closer with each other until either the chip recognition imaging unit or the substrate recognition imaging unit simultaneously images the chip recognition mark and the substrate recognition mark within the depth of field while relation between the position information about the chip recognition mark obtained using the chip recognition imaging unit and the position information about the substrate recognition mark obtained using the substrate recognition imaging unit is within an allowable range.

10. The mounting device according to claim 9, wherein an amount of movement necessary to bring the chip component within the allowable range is calculated while the relation between the position information about the chip recognition mark obtained using the chip recognition imaging unit and the position information about the substrate recognition mark obtained using the substrate recognition imaging unit is outside the allowable range, and after the chip component is moved until it falls within the allowable range, the chip component and the substrate are brought closer with each other until the imaging unit simultaneously images the chip recognition mark and the substrate recognition mark within the depth of field.

11. The mounting device according to claim 5, further comprising
a length measurement unit configured to measure distance between a surface of the substrate and a lower surface of the chip component,
height of the mounting head when performing the alignment being determined on the basis of a measurement result from the length measurement unit.

12. The mounting device according to claim 11, wherein the length measurement unit is provided to the mounting head.

13. The mounting device according to claim 11, wherein in-plane height distribution of the substrate or the substrate stage being obtained by the length measurement means.

14. A mounting device with which a chip component having a chip recognition mark for alignment is mounted at a mounting location on a substrate having a substrate recognition mark for alignment in an orientation in which the chip recognition mark and the substrate recognition mark face a same direction, the mounting device comprising:
a substrate stage configured to hold the substrate;
a mounting head configured to hold the chip component;
an elevating unit configured to raise and lower the mounting head in a direction perpendicular to the substrate;
a recognition mechanism configured to acquire position information about the chip recognition mark and position information about the substrate recognition mark using an imaging unit, and configured to move in an in-plane direction of the substrate;
a chip conveyance unit having a chip slider that is configured to convey the chip component directly under the mounting head to transfer the chip component to the mounting head; and
a control unit operatively connected to the recognition mechanism, the control unit being
configured to start acquiring the position information about the chip recognition mark from the imaging unit after the chip component is transferred to the mounting head and before the chip slider starts retracting from directly under the mounting head,
configured to bring the chip component and the substrate closer with each other based on the position information about the chip recognition mark such that the imaging unit simultaneously images the chip recognition mark and the substrate recognition mark within a depth of field,
configured to calculate an amount of positional deviation between the chip component and the substrate from the position information about the chip recognition mark and the position information about the substrate recognition mark obtained from the recognition mechanism, and
configured to perform alignment by driving the mounting head and/or the substrate stage according to the amount of the positional deviation in a state in which the imaging unit simultaneously images the chip recognition mark and the substrate recognition mark within the depth of field, after which the chip component and the substrate are brought into close contact with each other.

15. The mounting device according to claim 14, wherein the recognition mechanism is configured to acquire the position information about the substrate recognition mark on the substrate held on the substrate stage, and
the control unit is configured to control the substrate stage on the basis of the position information about the substrate recognition mark to dispose the mounting location on the substrate directly under the mounting head.

16. The mounting device according to claim 15, wherein the control unit is
configured to calculate positional deviation of the chip component with respect to the mounting location from the position information about the chip recognition mark obtained by using the imaging unit to image the chip component transferred from the chip slider to the mounting head,
configured to lower the mounting head while the positional deviation is within an allowable range, and
configured to bring the chip component and the substrate closer with each other until the imaging unit simultaneously images the chip recognition mark and the substrate recognition mark within the depth of field.

17. The mounting device according to claim 16, wherein an amount of movement necessary to bring the chip component within the allowable range is calculated while the positional deviation is outside the allowable range, and after the chip component is moved until it falls within the allowable range, the chip component and the substrate are brought closer with each other until the imaging unit simultaneously images the chip recognition mark and the substrate recognition mark within the depth of field.

18. The mounting device according to claim 14, wherein the imaging unit of the recognition mechanism includes a chip recognition imaging unit that is configured to focus on the chip recognition mark and a substrate recognition imaging unit that is configured to focus on the substrate recognition mark, the chip recognition imaging unit and the substrate recognition imaging unit being provided to branched optical paths having a shared optical axis.

19. The mounting device according to claim 18, wherein the chip component and the substrate are brought closer with each other until either the chip recognition imaging unit or the substrate recognition imaging unit simultaneously images the chip recognition mark and the substrate recognition mark within the depth of field while relation between the position information about the chip recognition mark obtained using the chip recognition imaging unit and the position information about the substrate recognition mark obtained using the substrate recognition imaging unit is within an allowable range.

20. The mounting device according to claim 19, wherein an amount of movement necessary to bring the chip component within the allowable range is calculated while the relation between the position information about the chip recognition mark obtained using the chip recognition imaging unit and the position information about the substrate recognition mark obtained using the substrate recognition imaging unit is outside the allowable range, and after the chip component is moved until it falls within the allowable range, the chip component and the substrate are brought closer with each other until the imaging unit simultaneously images the chip recognition mark and the substrate recognition mark within the depth of field.

21. The mounting device according to claim 14, further comprising
a length measurement unit configured to measure distance between a surface of the substrate and a lower surface of the chip component,
height of the mounting head when performing the alignment being determined on the basis of a measurement result from the length measurement unit.

22. The mounting device according to claim 21, wherein the length measurement unit is provided to the mounting head.

23. The mounting device according to claim 21, wherein in-plane height distribution of the substrate or the substrate stage being obtained by the length measurement means.

* * * * *